(12) United States Patent
Huotari et al.

(10) Patent No.: US 7,985,669 B2
(45) Date of Patent: *Jul. 26, 2011

(54) SELECTIVE DEPOSITION OF NOBLE METAL THIN FILMS

(75) Inventors: Hannu Huotari, Espo (FI); Marko Tuominen, Helsinki (FI); Miika Leinikka, Laajanitynkuja (FI)

(73) Assignee: ASM International N.V. (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/649,817

(22) Filed: Dec. 30, 2009

(65) Prior Publication Data

US 2010/0136776 A1      Jun. 3, 2010

Related U.S. Application Data

(63) Continuation of application No. 11/376,704, filed on Mar. 14, 2006, now Pat. No. 7,666,773.

(60) Provisional application No. 60/662,144, filed on Mar. 15, 2005, provisional application No. 60/662,145, filed on Mar. 15, 2005.

(51) Int. Cl.
*H01L 21/20* (2006.01)

(52) U.S. Cl. .............. 438/585; 438/758; 257/E21.637

(58) Field of Classification Search .............. 438/758, 438/765, 770, 784, 785, 787, 789, 790, 584, 438/585; 257/E21.637

See application file for complete search history.

(56) References Cited

U.S. PATENT DOCUMENTS

| | | | |
|---|---|---|---|
| 4,058,430 A | 11/1977 | Suntola et al. | |
| 4,477,296 A | 10/1984 | Nair | |
| 4,670,110 A | 6/1987 | Withers et al. | |
| 4,860,687 A | 8/1989 | Frijlink | |
| 4,902,551 A | 2/1990 | Nakaso et al. | |
| 4,965,656 A | 10/1990 | Koubuchi et al. | |
| 5,106,454 A | 4/1992 | Allardyce et al. | |
| 5,382,333 A | 1/1995 | Ando et al. | |
| 5,391,517 A | 2/1995 | Gelatos et al. | |
| 5,453,494 A | 9/1995 | Kirlin et al. | |
| 5,637,533 A | 6/1997 | Choi | |
| 5,695,810 A | 12/1997 | Dubin et al. | |
| 5,711,811 A | 1/1998 | Suntola et al. | |
| 5,731,634 A | 3/1998 | Matsuo et al. | |

(Continued)

FOREIGN PATENT DOCUMENTS

DE           41 08 73           8/1923

(Continued)

OTHER PUBLICATIONS

U.S. Appl. No. 10/782,727, filed Feb. 18, 2004, Lindfors et al.

(Continued)

*Primary Examiner* — Brook Kebede

(74) *Attorney, Agent, or Firm* — Knobbe, Martens, Olson & Bear, LLP

(57) ABSTRACT

Processes are provided for selectively depositing thin films comprising one or more noble metals on a substrate by vapor deposition processes. In some embodiments, atomic layer deposition (ALD) processes are used to deposit a noble metal containing thin film on a high-k material, metal, metal nitride or other conductive metal compound while avoiding deposition on a lower k insulator such as silicon oxide. The ability to deposit on a first surface, such as a high-k material, while avoiding deposition on a second surface, such as a silicon oxide or silicon nitride surface, may be utilized, for example, in the formation of a gate electrode.

22 Claims, 25 Drawing Sheets

U.S. PATENT DOCUMENTS

| | | |
|---|---|---|
| 5,820,664 A | 10/1998 | Gardiner et al. |
| 5,865,365 A | 2/1999 | Nishikawa et al. |
| 5,884,009 A | 3/1999 | Okase |
| 5,916,365 A | 6/1999 | Sherman |
| 5,923,056 A | 7/1999 | Lee et al. |
| 5,939,334 A | 8/1999 | Nguyen et al. |
| 5,989,672 A | 11/1999 | Hayashi |
| 5,998,048 A | 12/1999 | Jin et al. |
| 6,006,763 A | 12/1999 | Mori et al. |
| 6,015,986 A | 1/2000 | Schuegraf |
| 6,033,584 A | 3/2000 | Ngo et al. |
| 6,040,243 A | 3/2000 | Li et al. |
| 6,063,705 A | 5/2000 | Vaartstra |
| 6,066,892 A | 5/2000 | Ding et al. |
| 6,074,945 A | 6/2000 | Vaartstra et al. |
| 6,108,937 A | 8/2000 | Raaijmakers |
| 6,124,189 A | 9/2000 | Watanabe et al. |
| 6,130,123 A | 10/2000 | Liang et al. |
| 6,133,159 A | 10/2000 | Vaartstra et al. |
| 6,136,163 A | 10/2000 | Cheung et al. |
| 6,139,700 A | 10/2000 | Kang et al. |
| 6,143,658 A | 11/2000 | Donnelly et al. |
| 6,144,060 A | 11/2000 | Park et al. |
| 6,171,910 B1 | 1/2001 | Hobbs et al. |
| 6,203,613 B1 | 3/2001 | Gates et al. |
| 6,268,291 B1 | 7/2001 | Andricacos et al. |
| 6,270,572 B1 | 8/2001 | Kim et al. |
| 6,281,125 B1 | 8/2001 | Vaartstra et al. |
| 6,294,467 B1 | 9/2001 | Yokoyama et al. |
| 6,297,539 B1 | 10/2001 | Ma et al. |
| 6,303,500 B1 | 10/2001 | Jiang et al. |
| 6,305,314 B1 | 10/2001 | Sneh et al. |
| 6,306,756 B1 | 10/2001 | Hasunuma et al. |
| 6,320,213 B1 | 11/2001 | Kirlin et al. |
| 6,323,131 B1 | 11/2001 | Obeng et al. |
| 6,335,280 B1 | 1/2002 | Van der Jeugd |
| 6,342,277 B1 | 1/2002 | Sherman |
| 6,346,151 B1 | 2/2002 | Jiang et al. |
| 6,359,159 B1 | 3/2002 | Welch |
| 6,380,080 B2 | 4/2002 | Visokay |
| 6,391,785 B1 | 5/2002 | Satta et al. |
| 6,395,650 B1 | 5/2002 | Callegari et al. |
| 6,403,414 B2 | 6/2002 | Marsh |
| 6,404,191 B2 | 6/2002 | Daughton et al. |
| 6,420,189 B1 | 7/2002 | Lopatin |
| 6,433,432 B2 | 8/2002 | Shimizu |
| 6,444,568 B1 | 9/2002 | Sundararajan et al. |
| 6,444,868 B1 | 9/2002 | Vaughn et al. |
| 6,455,424 B1 | 9/2002 | McTeer et al. |
| 6,464,779 B1 | 10/2002 | Powell et al. |
| 6,475,276 B1 | 11/2002 | Elers et al. |
| 6,478,931 B1 | 11/2002 | Wadley et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,541,067 B1 | 4/2003 | Marsh et al. |
| 6,551,399 B1 | 4/2003 | Shen et al. |
| 6,576,053 B1 | 6/2003 | Kim et al. |
| 6,593,656 B2 | 7/2003 | Ahn et al. |
| 6,617,173 B1 | 9/2003 | Shen |
| 6,649,091 B2 | 11/2003 | Ryan et al. |
| 6,656,748 B2 | 12/2003 | Hall et al. |
| 6,664,192 B2 | 12/2003 | Satta et al. |
| 6,679,951 B2 | 1/2004 | Soininen et al. |
| 6,680,540 B2 | 1/2004 | Nakano et al. |
| 6,703,708 B2 | 3/2004 | Werkhoven et al. |
| 6,720,262 B2 | 4/2004 | Koh et al. |
| 6,759,325 B2 | 7/2004 | Raaijmakers et al. |
| 6,777,331 B2 | 8/2004 | Nguyen |
| 6,784,101 B1 | 8/2004 | Yu et al. |
| 6,784,504 B2 | 8/2004 | Derderian et al. |
| 6,800,542 B2 | 10/2004 | Kim |
| 6,800,567 B2 | 10/2004 | Cho et al. |
| 6,824,816 B2 | 11/2004 | Aaltonen et al. |
| 6,842,740 B1 | 1/2005 | Jeran et al. |
| 6,849,122 B1 | 2/2005 | Fair |
| 6,852,635 B2 | 2/2005 | Satta et al. |
| 6,878,628 B2 | 4/2005 | Sophie et al. |
| 6,881,260 B2 | 4/2005 | Marsh et al. |
| 6,881,437 B2 | 4/2005 | Ivanov et al. |
| 6,887,795 B2 | 5/2005 | Soininen et al. |
| 6,921,712 B2 | 7/2005 | Soininen et al. |
| 6,936,535 B2 | 8/2005 | Kim et al. |
| 6,955,986 B2 | 10/2005 | Li |
| 6,984,591 B1 | 1/2006 | Buchanan et al. |
| 7,011,981 B2 | 3/2006 | Kim et al. |
| 7,067,407 B2 | 6/2006 | Kostamo et al. |
| 7,105,054 B2 | 9/2006 | Lindfors |
| 7,107,998 B2 | 9/2006 | Greer et al. |
| 7,118,779 B2 | 10/2006 | Verghese et al. |
| 7,135,207 B2 | 11/2006 | Min et al. |
| 7,220,669 B2 | 5/2007 | Hujanen et al. |
| 7,241,677 B2 | 7/2007 | Soinenen et al. |
| 7,256,144 B2 | 8/2007 | Koyanagi et al. |
| 7,273,526 B2 | 9/2007 | Shinriki et al. |
| 7,273,814 B2 | 9/2007 | Matsuda |
| 7,300,873 B2 | 11/2007 | Millward |
| 7,404,985 B2 | 7/2008 | Chang et al. |
| 7,435,484 B2 | 10/2008 | Shinriki et al. |
| 7,438,949 B2 | 10/2008 | Weidman |
| 7,494,927 B2 | 2/2009 | Kostamo et al. |
| 7,666,773 B2 * | 2/2010 | Huotari et al. .............. 438/584 |
| 2001/0003064 A1 | 6/2001 | Ohto |
| 2001/0013617 A1 | 8/2001 | Toyoda et al. |
| 2001/0018266 A1 | 8/2001 | Jiang et al. |
| 2001/0030366 A1 | 10/2001 | Nakano et al. |
| 2001/0052318 A1 | 12/2001 | Jiang et al. |
| 2002/0004293 A1 | 1/2002 | Soininen et al. |
| 2002/0006711 A1 | 1/2002 | Yamazaki et al. |
| 2002/0013487 A1 | 1/2002 | Norman et al. |
| 2002/0027286 A1 | 3/2002 | Sundararajan et al. |
| 2002/0173054 A1 | 11/2002 | Kim |
| 2003/0013302 A1 | 1/2003 | Nguyen et al. |
| 2003/0135061 A1 | 7/2003 | Norman et al. |
| 2003/0165615 A1 | 9/2003 | Aaltonen et al. |
| 2003/0214043 A1 | 11/2003 | Saitoh et al. |
| 2003/0233976 A1 | 12/2003 | Marsh et al. |
| 2004/0005753 A1 | 1/2004 | Kostamo et al. |
| 2004/0038529 A1 | 2/2004 | Soininen et al. |
| 2004/0053496 A1 | 3/2004 | Choi |
| 2004/0082125 A1 | 4/2004 | Hou et al. |
| 2004/0087143 A1 | 5/2004 | Norman et al. |
| 2004/0105934 A1 | 6/2004 | Chang et al. |
| 2004/0118697 A1 | 6/2004 | Wen et al. |
| 2004/0126944 A1 | 7/2004 | Rotondaro et al. |
| 2004/0142558 A1 | 7/2004 | Granneman |
| 2004/0152255 A1 | 8/2004 | Seidl et al. |
| 2004/0192021 A1 | 9/2004 | Li |
| 2004/0192036 A1 | 9/2004 | Koyanagi et al. |
| 2004/0214354 A1 | 10/2004 | Marsh et al. |
| 2004/0216668 A1 | 11/2004 | Lindfors et al. |
| 2004/0224475 A1 | 11/2004 | Lee et al. |
| 2005/0009325 A1 | 1/2005 | Chung et al. |
| 2005/0020060 A1 | 1/2005 | Aaltonen et al. |
| 2005/0048794 A1 | 3/2005 | Brask et al. |
| 2005/0082587 A1 | 4/2005 | Marsh |
| 2005/0085031 A1 | 4/2005 | Lopatin et al. |
| 2005/0087879 A1 | 4/2005 | Won et al. |
| 2005/0089632 A1 | 4/2005 | Vehkamaki et al. |
| 2005/0092247 A1 | 5/2005 | Schmidt et al. |
| 2005/0098440 A1 | 5/2005 | Kailasam et al. |
| 2005/0124154 A1 | 6/2005 | Park et al. |
| 2005/0181555 A1 | 8/2005 | Haukka et al. |
| 2005/0208754 A1 | 9/2005 | Kostamo et al. |
| 2005/0229848 A1 | 10/2005 | Shinriki et al. |
| 2006/0013955 A1 | 1/2006 | Senzaki |
| 2006/0035462 A1 | 2/2006 | Millward |
| 2006/0073276 A1 | 4/2006 | Antonissen |
| 2006/0093848 A1 | 5/2006 | Senkevich et al. |
| 2006/0118968 A1 | 6/2006 | Johnson et al. |
| 2006/0121733 A1 | 6/2006 | Kilpela et al. |
| 2006/0128150 A1 | 6/2006 | Gandikota et al. |
| 2006/0137608 A1 | 6/2006 | Choi et al. |
| 2006/0177601 A1 | 8/2006 | Park et al. |
| 2006/0216932 A1 | 9/2006 | Kumar et al. |
| 2006/0223300 A1 | 10/2006 | Simka et al. |

| | | | |
|---|---|---|---|
| 2006/0263977 | A1 | 11/2006 | Kim et al. |
| 2007/0026654 | A1 | 2/2007 | Huotari et al. |
| 2007/0036892 | A1 | 2/2007 | Haukka et al. |
| 2007/0059502 | A1 | 3/2007 | Wang et al. |
| 2007/0082132 | A1 | 4/2007 | Shinriki et al. |
| 2007/0190782 | A1 | 8/2007 | Park |
| 2008/0038465 | A1 | 2/2008 | Dussarrat |
| 2008/0054472 | A1 | 3/2008 | Shinriki et al. |
| 2008/0124484 | A1 | 5/2008 | Shinriki et al. |
| 2008/0146042 | A1 | 6/2008 | Kostamo et al. |
| 2008/0171436 | A1 | 7/2008 | Koh et al. |
| 2008/0214003 | A1 | 9/2008 | Xia |
| 2008/0318417 | A1 | 12/2008 | Shinriki et al. |
| 2009/0087339 | A1 | 4/2009 | Shinriki |
| 2009/0104777 | A1 | 4/2009 | Kim |

FOREIGN PATENT DOCUMENTS

| | | |
|---|---|---|
| EP | 0 469 456 | 7/1991 |
| EP | 0 469 470 A1 | 2/1992 |
| EP | 0 880 168 A2 | 11/1998 |
| EP | 1 688 923 A2 | 8/2006 |
| GB | 368850 | 12/1930 |
| GB | 1518243 | 7/1978 |
| GB | 2 340 508 A | 2/2000 |
| JP | 1998-340994 | 12/1998 |
| JP | 2003-168738 A | 6/2003 |
| KR | 10-2001-004717 | 1/2001 |
| KR | 10-2001-004718 | 1/2001 |
| KR | 10-2001-004719 | 1/2001 |
| KR | 10-2001-96408 | 11/2001 |
| KR | 10-2001-12889 | 12/2001 |
| KR | 10-2003-0011399 | 2/2003 |
| KR | 10-2005-0103373 | 10/2005 |
| WO | WO 93-10652 | 5/1993 |
| WO | WO 98-01890 | 1/1998 |
| WO | WO 99-17343 | 4/1999 |
| WO | WO 00-03420 | 1/2000 |
| WO | WO 00-38191 | 6/2000 |
| WO | WO 01-88972 | 5/2001 |
| WO | WO 01-50502 | 7/2001 |
| WO | WO 02-09126 | 7/2001 |
| WO | WO 02-09158 | 7/2001 |
| WO | WO 03-023835 | 3/2003 |
| WO | WO 03-056612 A1 | 7/2003 |
| WO | WO 2004-035858 | 4/2004 |
| WO | WO 2006-035281 | 4/2006 |

OTHER PUBLICATIONS

U.S. Appl. No. 12/337,141, filed Dec. 17, 2008, Kim et al.
U.S. Appl. No. 11/955,275, filed Dec. 12, 2007, Shinriki.
U.S. Appl. No. 12/129,345, filed May 29, 2008, Shinriki et al.
U.S. Appl. No. 12/201,434, filed Aug. 29, 2008, Shinriki et al.
U.S. Appl. No. 60/976,378, filed Sep. 28, 2007, Shinriki H.
U.S. Appl. No. 61/178,871, filed May 15, 2009, Hamalainen et al.
Aaltonen et al., "ALD of Rhodium Thin Films from Rh (acac)$_3$ and Oxygen," Electrochem. Solid-State Lett. 8 (8): C99-C101 (2005).
Aaltonen et al., "Atomic Layer Deposition of Iridium Thin Films," J. Electrochem. Soc. 151(8): G489-G492 (2004).
Aaltonen et al., "Atomic Layer Deposition of Noble Metal Thin Films," dissertation presented at the University of Helsinki, Helsinki, Finland, 2005.
Aaltonen et al., "Atomic Layer Deposition of Noble Metals: Exploration of the Low Limit of the Deposition Temperature," J. Mat. Res. Soc. 19 (11): 3353-3358 (2004).
Aaltonen et al., "Atomic Layer Deposition of Platinum Thin Films," Chem. Mater. 15: 1924-1928 (2003).
Ackerman et al., "Identifying Tunneling in Ferromagnetic-Insulator-Ferromagnetic Thin Film Structures," World Wide Web, physics. ucsd.eduiksgrp-Tunneling.html, pp. 1-6.
Addison et al., "The Vapour Pressure of Anhydrous Copper Nitrate, and its Molecular Weight in the Vapour State," J. Chem. Soc., pp. 3099-3106 (1958).
Aoyama et al., "Chemical Vapor Deposition of Ru and Its Application in (Ba, Sr) TiO$_3$ Capacitors for Future Dynamic Random Access Memories," Jpn. J. Appl. Phys. 38(43): 2194-2199 (1999).

Arnal et al., Materials and processes for high signal propagation performance and reliable 32 nm node BEOL., 1-4244-1069-X-07, 2007 IEEE, pp. 1-3.
Baklanov et al., "Characterization of Cu surface cleaning by hydrogen plasma," Journal Vac. Sci. Technol 19(4): 1201-1211 (2001).
Baliga, J., "New Designs and Materials Tackle 1 Gb Memory Challenge," Semiconductor International, World Wide Web address: semiconductor.net, Nov. 2000.
Basceri, C., "Electrial Dielectric Properties of (Ba,Sr) TiO3 Thin Film Capacitors for Ultra-High Density Dynamic Random Access Memories", Thesis, 1997.
Bobo et al., Spin Dependent Tunneling Junctions with Hard Magnetic Layer Pinning, Journal of Applied Physics, vol. 83. No. 11, pp. 6685-6687, (1998).
Bursky, "Hit Up IEDM for Gigabit and Denser DRAMs and Merged Logic-Memory," Electronic Design, World Wide Web address: planetee.com, Dec. 1, 1998.
Campbell et al., "Titanium dioxide (TiO2)-based gate insulators," IBM J. Res. Develop., May 1999, pp. 383-392, vol. 43, No. 3.
Daughton, World Wide Web nve.com-otherbiz-mram2.pdf "Advanced MRAM Concepts," p. 1-6, (Feb. 7, 2001).
Fereday et al., "Anhydrous Cobalt (III) Nitrate," Chemical Communications, p. 271 (1968).
File Wrapper for U.S. Appl. No. 11/254,071.
Fukuzumi et al., "Liner-Supported Cylinder (LSC) Technology to Realize Ru-Ta$_2$O$_5$-Ru Capacitor for Future DRAMs," IEEE, IED 2000, Session 34 (2000).
Fullerton et al., "Advanced Magnetic Recording Media for High-Density Data," Solid State Technology 44(i9): 87 (2001).
Hones et al., "MOCVD of Thin Ruthenium Oxide Films: Properties and Growth Kinetics," Chem. Vap. Deposition 6(4): 193-198 (2000).
Hoyas et al., Growth and characterization of atomic layer deposited WC0.7N0.3 on polymer films, Journal of Applied Physics, Jan. 1, 2004, vol. 95, Issue 1, pp. 381-388.
Hu et al., "In situ rapid thermal oxidation and reduction of copper thin films and their applications in ultralarge scale integration," Journal of the Electrochemical Society 148(12): G669-G675 (2001).
Imai, Tajuki World Wide Web nikkeibp.asiabiztech.com-nea-200008-tech_108675.html, "100 Gbit-Inch HDD Just Around the Corner," p. 1-6, (Aug. 2000).
Inoue et al., "Low thermal-budget fabrication of sputtered-PZT capacitor on multilevel interconnects for embedded FeRAM," IEEE, IED 2000, 2000, Session 34.
Integrated Circuit Engineering Corporation, Practical Integrated Circuit Fabrication Seminar (1998).
Jeong, et al. "Plasma enhanced atomic layer deposition of RuTaN thin films for the applicaiton of Cu diffusion barrier", ALD Conference, 2006, pp. 1-23.
Jung et al., "A Novel Ir-IrO$_2$-Pt-PZT-Pt-IrO$_2$-Ir Capacitor for a Highly Reliable Mega-Scale FRAM," IEEE, IED 2000, Session 34 (2000).
Kawaguchi, "MPEG1 Decoder LSI for video CD mPD61012," *NEC Device Technology International*, New Products 5 No. 48, pp. 4-8 (Jan. 1998).
Kawamoto et al., "The Outlook for Semiconductor Processes and Manufacturing Technologies in the 0.1-μm Age," Hitachi Review 48(6): 334-339 (1999).
Kwon et al., "Ruthenium Bottom Electrode Prepared by Electroplating for a High Density DRAM Capacitor," J. Electrochem. Soc. 151(2): C127-C132 (2004).
Kwon et al., Plasma-enhance atomic layer deposition of RuTiN thin films for the applicaiton of copper diffusion barrier, ALD Conference, 2004.
Kwon, et al., "Plasma-enhanced Atomic Layer Deposition of Ruthenium Thin Films", Electrochemical and Solid-State Letters, 7(4), C46-C48 (2004).
Lee et al., "Electroless CoWP boosts cooper reliability, device performance," Semiconductor International, Jul. 1, 2004, 5 pages.
Namba et al., PEALD of Ru layer on WNC ALD barrier for Cu-porous low-k, Proceedings of Advanced Metallization Conference 2006, p. 39.

NEC Device Technology International, "Current state of leading edge ULSI process technology and future trends," No. 48, pp. 4-8 (1998).

Nilsen et al. ,"Thin Film Deposition of Lanthanum Manganite Perovskite by the ALE process," Journal of Materials Chemistry, vol. 9, 1781-1784, (1999).

Notice of Allowance for U.S. Appl. No. 11/254,071 sent Sep. 17, 2008.

Office Action dated Aug. 10, 2006, received in U.S. Appl. No. 10/394,430.

Office Action dated Aug. 20, 2003, received in U.S. Appl. No. 10/300,169.

Office Action dated Dec. 14, 2006, received in U.S. Appl. No. 10/394,430.

Office Action dated Dec. 24, 2003, received in U.S. Appl. No. 10/300,169.

Office Action dated Jun. 11, 2008, received in U.S. Appl. No. 11/179,791.

Office Action dated Mar. 17, 2009 for U.S. Appl. No. 11/376,704, filed Mar. 14, 2006.

Office Action dated Sep. 13, 2007, received in U.S. Appl. No. 10/394,430.

Office Action for U.S. Appl. No. 11/182,734, filed Jul. 15, 2005, dated Aug. 21, 2008.

Office Action for U.S. Appl. No. 11/182,734, filed Jul. 15, 2005, dated Dec. 29, 2008.

Office action for U.S. Appl. No. 11/182,734, dated Mar. 17, 2009.

Onda et al., "Hydrogen plasma cleaning a novel process for IC-packaging," Semicon West 97, Packaging Materials Conference, 1997, pp. D-1-D-10.

Onda, N. et al., "Hydrogen Plasma Cleaning a Novel Process for IC-Packaging," p. 311, World Wide Web Address: Semiconductor Fabtech.com, 1998.

Pakrad, "Pure Tech: Growth of MR-GMR Head Materials," World Wide Web, Puretechinc.com-tech_papers-tech_papers-4.htm, pp. 1-2, (1999).

Paranjpe et al., Atomic Layer Deposition of AlOx for thin Film Head Gap Applications, Journal of Electrochemical Society, V 148 (9), G465-G471.

Parsons et al., "Microcontact Patterning of Ruthenium Gate Electrodes by Selective Area," North Carolina State university, presentation at AVS conference on Atomic Layer Deposition (ALD 2004), Helsinki, Finland, Aug. 16, 2004.

Ritala et al., "Atomic Layer Deposition," Handbook of Thin Film Materials vol. 1: Deposition and Processing of Thin Films, chapter 2, pp. 103-159 (2002).

Rossnagel, "The latest on Ru-Cu interconnect technology," Solid State Technology, Feb. 2005, Online, pp. 1-4.

Sakurai et al., "Adsorption of ruthenium tetroxide on metal surfaces," *J. Phys. Chem. American Chemical Society*, vol. 89, pp. 1892-1896 (1985).

Satta et al., "The Removal of Copper Oxides by Ethyl Alcohol Monitored in Situ by Spectroscopic Ellipsometry," Journal of the Electromechanical Society, 150 (5) , pp. 300-306 (2003).

Shao et al., An alternative low resistance MOL technology with electroplated rhodium as contact plugs for 32nm CMOS and beyond, 1-4244-1070-3-07, 2007 IEEE.

Singer, Peter, "Progress in Copper: A Look Ahead", Semiconductor International, May 1, 2002.

SOI Technology: IMB's Next Advance in Chip Design, 1998.

Solanki et al., "Atomic Layer Deposition of Copper Seed Layers," Electrochemical and Solid-State Letters 3(10): 479-480 (2000).

Sundani et al., "Oral Presentation of Dual Damascene Process," slides, Nov. 19, 1998.

Suntola, "Atomic Layer Epitaxy," Handbook of Crystal Growth, vol. 3, chapter 14, pp. 601-663 (1994).

T. Aaltonen et al. "Atomic Layer Deposition of Ruthenium Thin Films from Ru(thd)3 and Oxygen," Chem. Vap. Deposition, 10, pp. 25-219.

T. Aaltonen et al. "Reaction Mechanism Studies on Atomic Layer Deposition of Ruthenium and Platinum," Electrochem. Solid-State Lett., 6 (2003), C130-133.

Tung et al., Atomic layer deposition of noble metals: Exploration of the low limit of the deposition temperature, J Mater. Res., vol. 19, No. 11, p. 3353-3357 (Nov. 2004).

U.S. Appl. No. 11/254,071, filed Oct. 18, 2005; Office Action sent Nov. 15, 2007.

Ueno et al. Cleaning of CHF3 plasma-etched SiO2-SiN-Cu via structures using a hydrogen plasma, an oxygen plasma and hexafluoracetylacetone vapors, J. Vac. Sci. Technology B vol. 16, No. 6, pp. 2986-2995 (1998).

Utriainen et al., "Studies of metallic thin film growth in an atomic layer epitaxy reactor using $M(acac)_2$ (M=Ni, Cu, Pt) precursors," Applied Surface Science 157: 151-158 (2000).

Utriainen et al., "Studies of NiO thin film formation by atomic layer epitaxy," Materials Science and Engineering B54: 98-103 (1998).

Wang, Shan X. "Advanced Materials for Extremely High Density Magnetic Recording Heads," Department of Materials Science and Engineering, Department of Electrical Engineering, Stanford University, Stanford, CA 94305-4045, presentation.

Winbond News Release, "Successful development of capacitor technology for next generation memory," World Wide Web address: winbond.com, Dec. 13, 2000.

Won et al., "Conformal CVD-ruthenium process for MIM capacitor in giga-bit DRAMs," IEEE, IED 2000, Session 34 (2000).

World Wide web, magahaus.com-tech-westerndigital-shitepapers-gmr_wp.shtml, "GMR Head Technology: Increased Areal Density and Improved Performance Areal Density," pp. 1-4, (Feb. 2000).

World Wide Web, pc.guide.com-ref-hdd-op-heads-techGMR-c.html, "Giant Magnetoresistive (GMR) Heads," pp. 1-4.

World Wide web, semiconductor.net-semiconductor-issues-Issues-1998-feb98-docs-emerging.asp, "GMR Read-Write Heads Yield Data Storage Record," pp. 1-2 (Feb. 1998).

World Wide Web, stoner.leeds.ac.uk-research-gmr.htm, "Giant Magnetoresistance," pp. 1-6.

Xu et al., "A breakthrough in low-k barrier-etch stop films for copper damascene applications," Semiconductor Fabtech, 2000, pp. 239-244, 11th Edition.

Yagishita et al., "Cleaning of Copper Surface Using Vapor-Phase Organic Acids," MRS Proceedings, vol. 766, MRS Spring 2003 Meeting, Apr. 21-25, 2003, Symposium E, Session E3, Paper E3.28.

Yang et al., Physical, Electrical, and Relaiability Characterization of Ru for Cu Interconnects, 2006 International Interconnect Technology Conference, pp. 187-190, ISBN 1-4244-0103-8-06, 2006 IEEE.

Yoon et al., "Development of an RTA process for the enhanced crystallization of amorphous silicon thin film," Electrochemical Society Proceedings 2000-9: 337-343 (2000).

Yoon et al., "Investigation of $RuO_2$-incorporated Pt layer as a Bottom Electrode and Diffusion Barrier for High Epsilon Capacitor Applications," Electrochemical and Solid-State Letters 3(8): 373-376 (2000).

Yoon et al., "Tantalum-ruthenium dioxide as a diffusion barrier between Pt bottom electrode and $TiSi_2$ ohmic contact layer for high density capacitors," Journal of Applied Physics 86(5): 2544-2549 (1999).

Yoon, Y.-G. et al., $197^{th}$ Meeting Program Information II, The Electrochemical Society, $197^{th}$ Meeting—Toronto, Ontario, Canada, May 14-18, 2000, Program Information, I1—Rapid Thermal and Other Short-Time Processing Technologies I, Electronics Division-Dielectric Science and Technology Division-High Temperature Materials Division, 2000, Wednesday, May 17, 2000, New Applications of RTP, Co-Chairs: A. Fiory and D.-L Kwong, time 11:10 Abs#550, Title: Development of RTA Process for the Crystallization of a-Si Thin Film—Y.-G. Yoong, T.-K. Kim, K.-B. Kim J.-Y. Chio, B.-I. Lee, and S.-K. Joo (Seoul National Univ.).

\* cited by examiner

SELECTIVE DEPOSITION OF NOBLE METAL THIN FILMS

REFERENCE TO RELATED APPLICATIONS

The application is a continuation of U.S. application Ser. No. 11/376,704, filed Mar. 14, 2006, which claims priority to U.S. provisional application No. 60/662,144, filed Mar. 15, 2005 and is related to U.S. provisional application No. 60/662,145, filed Mar. 15, 2005, each of which is hereby incorporated by reference in its entirety.

BACKGROUND OF THE INVENTION

1. Field of the Invention

Conductive thin films can be selectively deposited by vapor deposition processes, such as by atomic layer deposition type processes. Such films find use, for example, in integrated circuits (IC) and magnetic recording media.

2. Description of the Related Art

Thin films of ruthenium and other noble metals can be used in a wide variety of applications including integrated circuits and magnetic recording media. For example, ruthenium may be used as an electrode material in transistors, particularly those where silicon oxide is replaced by high-k dielectrics. They can also be used as copper seed layers in metallization processes. Noble metals are advantageous because they tend not to oxidize or otherwise corrode.

Noble metal films can also be used for capacitor electrodes of dynamic random access memories (DRAMs). Noble metals are also a potential electrode material for nonvolatile ferroelectric memories.

In addition to electrode applications, thin noble metal films find potential use in magnetic recording technology. In antiferromagnetically coupled recording media, for example, a thin Ru film may be used for separating two ferromagnetic layers.

SUMMARY OF THE INVENTION

Thin films of noble metals can be selectively deposited using vapor deposition processes, such as atomic layer deposition (ALD). In some embodiments, a preferred ALD process comprises alternately contacting a first surface and a second surface of a substrate with a noble metal precursor and a second reactant, such that a thin noble metal film is selectively formed on the first surface relative to the second surface. The first surface may be, for example, a high-k material, a metal or a conductive metal compound, such as a metal nitride or metal oxide. The second surface preferably comprises a lower k insulator, such as a form of silicon oxide or silicon nitride. For example and without limitation, the second surface may comprise $SiO_2$ or silicon oxynitride. The atomic layer deposition reactions are preferably carried out at a temperature less than about 400° C., more preferably less than about 350° C.

In some preferred embodiments, a gate electrode is formed by a method comprising depositing and patterning a gate dielectric layer and selectively depositing a noble metal such as ruthenium over the gate dielectric layer by a vapor phase deposition process, preferably an atomic layer deposition process.

In other preferred methods for forming a gate electrode on a silicon substrate, an interface layer is formed on the substrate. The interface layer may comprise, for example, silicon oxide or silicon nitride. A layer of high-k material is deposited over the interface layer and patterned. Ruthenium or another noble metal is selectively deposited over the high-k material by a vapor deposition process, more preferably an atomic layer deposition process.

ALD processes for depositing noble metal preferably comprise contacting the substrate with alternating and sequential pulses of a noble metal precursor, such as a ruthenium precursor, and a second reactant, such as an oxygen precursor. The noble metal precursor is preferably a cyclopentadienyl compound, more preferably an ethyl cyclopentadienyl compound, such as $Ru(EtCp)_2$.

DETAILED DESCRIPTION OF THE PREFERRED EMBODIMENTS

Figure 1:
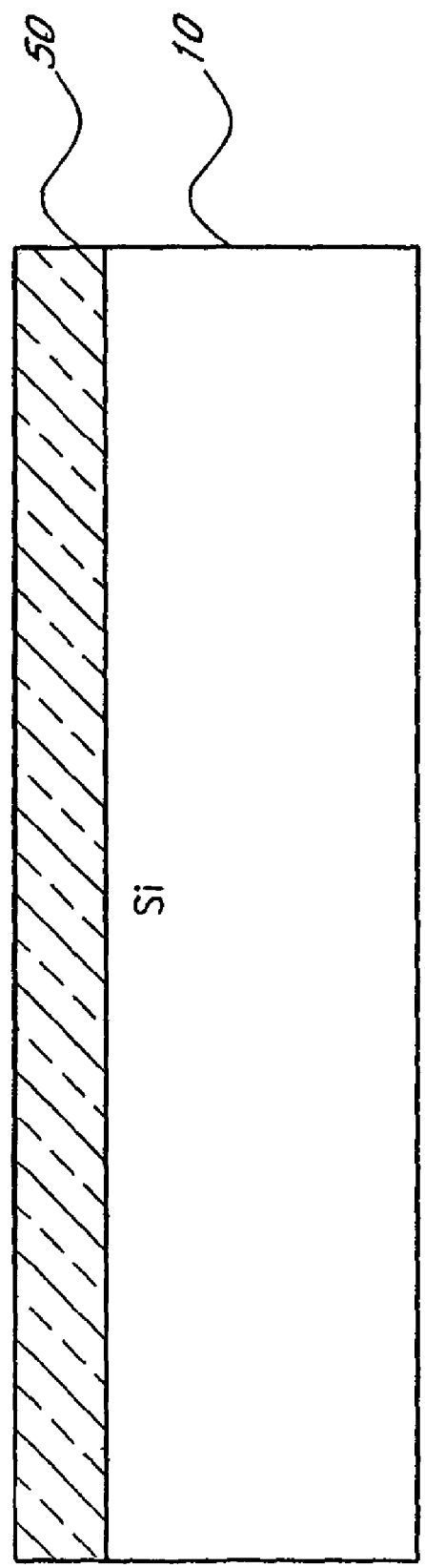
FIGS. 1-6 are schematic cross-sections of partially fabricated integrated circuits, illustrating a process flow for the formation of a gate electrode utilizing a selective noble metal deposition process.

Ruthenium thin films and thin films comprising other noble metals can be selectively deposited on a substrate by vapor phase deposition processes, such as atomic layer deposition (ALD) type processes. The substrate includes at least a first surface and a second surface, which differ in material composition and properties. The first surface is preferably susceptible to the vapor phase deposition process, such as an ALD process, used to form the desired noble metal layer while the second surface is substantially insensitive to the same deposition process. As a result, the noble metal is selectively deposited on the first surface relative to the second surface. In some embodiments deposition occurs on the first surface but not on the second surface. However, although the film is deposited selectively on the first surface, some deposition on the second surface is possible. Thus, in other embodiments deposition occurs to a greater extent on the first surface than the second surface in a given time.

At temperatures less than 450° C., noble metals are readily deposited on many high-k materials, metals, metal nitrides, and other conductive metal compounds from vapor phase reactants. For example, they can be deposited by ALD. However, they are not readily deposited on lower k materials, such as silicon oxides and silicon nitrides. Thus, in particular embodiments, a thin film containing noble metal is selectively deposited on a first surface comprising a high-k material while avoiding deposition on a second surface comprising a lower k insulator such as a silicon oxide, silicon nitride, silicon oxynitride, fluorinated silica glass (FSG), carbon doped silicon oxide (SiOC) or material containing more than 50% of silicon oxide. In other embodiments the thin film comprising one or more noble metals is selectively deposited on a first surface comprising a metal, metal nitride, metal carbide, metal boride, other conductive metal compound or mixtures thereof, while avoiding deposition on a second surface comprising an insulating material, such as a low k insulator. In preferred embodiments an ALD type process is employed to selectively deposit the noble metal containing film.

"High-k" generally refers to a dielectric material having a dielectric constant (k) value greater than that of silicon oxide. Preferably, the high-k material has a dielectric constant greater than 5, more preferably greater than about 10. Exemplary high-k materials include, without limitation, $HfO_2$, $ZrO_2$, $Al_2O_3$, $TiO_2$, $Ta_2O_5$, lanthanide oxides and mixtures thereof, silicates and materials such as YSZ (yttria-stabilized zirconia), BST, BT, ST, and SBT.

Metals, metal nitrides, metal carbides, metal borides, conductive oxides and other conductive metal compounds that can serve as substrate materials over which noble metals can be selectively deposited may include, for example and without limitation, selected from the group consisting of Ta, TaN, $TaC_x$, $TaB_x$, Ti, TiN, $TiC_x$, $TiB_x$, Nb, NbN, $NbC_x$, $NbB_x$ Mo, MoN, $MoC_x$, $MoB_x$, W, WN, $WC_x$, $WB_x$, V, Cr, Fe, Cu, Co, Ni, Cd, Zn, Al, Ag, Au, Ru, $RuO_x$, Rh, Pt, Pd, Ir, $IrO_x$ and Os.

While illustrated in the context of formation of a gate electrode by ALD, the skilled artisan will readily find application for the principles and advantages disclosed herein in other contexts, particularly where selective deposition is desired with high step coverage.

ALD type processes are based on controlled, self-limiting surface reactions of the precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses. This may be accomplished with an evacuation step and/or with an inactive gas pulse or purge.

Briefly, the substrate is loaded in a reaction chamber and is heated to a suitable deposition temperature, generally at lowered pressure. Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved. Here, the temperature is also maintained low enough to ensure the selectivity of the deposition process. Preferably, the temperature is below about 450° C., more preferably below about 350° C., as discussed in more detail below.

A first reactant is conducted into the chamber in the form of gas phase pulse and contacted with the surface of the substrate. Preferably the deposition process is self-limiting. For ALD embodiments, conditions are selected such that no more than about one monolayer of the precursor is adsorbed on the substrate surface in a self-limiting manner. Excess first reactant and reaction byproducts, if any, are purged from the reaction chamber, often with a pulse of inert gas such as nitrogen or argon.

For ALD embodiments, the second gaseous reactant is pulsed into the chamber where it reacts with the first reactant adsorbed to the surface. Excess second reactant and gaseous by-products of the surface reaction are purged out of the reaction chamber, preferably with the aid of an inert gas. The steps of pulsing and purging are repeated until a thin film of the desired thickness has been selectively formed on the substrate, with each cycle leaving no more than a molecular monolayer.

As mentioned above, each pulse or phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus excellent step coverage.

According to a preferred embodiment, a noble metal thin film is selectively deposited on a first surface of a substrate relative to a second surface by an ALD type process comprising multiple pulsing cycles, each cycle comprising:
  pulsing a vaporized noble metal precursor into the reaction chamber to form a molecular layer of the metal precursor on the first surface of the substrate,
  purging the reaction chamber to remove excess noble metal precursor and reaction by products, if any,
  providing a pulse of a second reactant, such as an oxygen, ozone, ammonia or ammonia plasma product containing gas onto the substrate,
  purging the reaction chamber to remove excess second reactant and any gaseous by-products formed in the reaction between the metal precursor layer on the first surface of the substrate and the second reactant, and
  repeating the pulsing and purging steps until a noble metal thin film of the desired thickness has been formed.

The noble metal thin film typically comprises multiple monolayers of a single noble metal. However, in other embodiments, the final metal structure may comprise noble metal compounds or alloys comprising two or more different noble metals. For example, the growth can be started with the deposition of platinum and ended with the deposition of ruthenium metal. Noble metals are preferably selected from the group consisting of Pt, Au, Ru, Rh, Ir, Pd and Ag.

The substrate can comprise various types of materials. When manufacturing integrated circuits, the substrate typically comprises a number of thin films with varying chemical and physical properties. In preferred embodiments, at least one surface of the substrate is insensitive to the vapor phase deposition reaction. Preferably, this surface comprises a form of silicon oxide or a silicon nitride, such as silicon oxynitride. At least one other surface of the substrate is sensitive to the deposition reaction and may be, for example and without limitation, a dielectric layer, such as aluminum oxide or hafnium oxide, a metal, such as Ta, or a metal nitride, such as TaN. Further, the substrate surface may have been patterned and may comprise structures such as nodes, vias and trenches.

Suitable noble metal precursors may be selected by the skilled artisan. In general, metal compounds where the metal is bound or coordinated to oxygen, nitrogen, carbon or a combination thereof are preferred. More preferably metallocene compounds, beta-diketonate compounds and acetamidinato compounds are used. In some embodiments a cyclopentadienyl precursor compound is used, preferably a bis (ethylcyclopentadienyl) compound.

When depositing ruthenium (Ru) thin films, preferred metal precursors may be selected from the group consisting of bis(cyclopentadienyl)ruthenium, tris(2,2,6,6-tetramethyl-3,5-heptanedionato)ruthenium and tris(N,N'-diisopropylacetamidinato)ruthenium(III) and their derivatives, such as bis (N,N'-diisopropylacetamidinato)ruthenium(II) dicarbonyl, bis(ethylcyclopentadienyl)ruthenium, bis(pentamethylcyclopentadienyl)ruthenium and bis(2,2,6,6-tetramethyl-3,5-heptanedionato)(1,5-cyclooctadiene)ruthenium(II). In preferred embodiments, the precursor is bis (ethylcyclopentadienyl) ruthenium ($Ru(EtCp)_2$).

When depositing platinum films, preferred metal precursors include (trimethyl)methylcyclopentadienylplatinum (IV), platinum (II) acetylacetonato, bis(2,2,6,6-tetramethyl-3,5-heptanedionato)platinum(TI) and their derivatives.

As mentioned above, ALD processes for depositing noble metal containing films typically comprise alternating pulses of a noble metal precursor and an oxygen-containing reactant. The oxygen-containing reactant pulse may be provided, for example, by pulsing diatomic oxygen gas or a mixture of oxygen and another gas into the reaction chamber. In one embodiment, ammonia plasma products or ammonia is used as a second reactant. In other embodiments, oxygen is formed inside the reactor, such as by decomposing oxygen containing chemicals. Oxygen containing chemicals that can be decomposed in the reactor to produce oxygen include, without limitation, $H_2O_2$, $N_2O$ and organic peroxides. Mixtures of such chemicals can also be used. In other embodiments, the catalytic formation of an oxygen containing pulse can be provided by introducing into the reactor a pulse of vaporized aqueous solution of $H_2O_2$ and conducting the pulse over a catalytic surface inside the reactor and thereafter into the reaction chamber. The catalytic surface is preferably a piece of platinum or palladium.

In preferred embodiments the oxygen-containing reagent comprises free-oxygen or ozone, more preferably molecular oxygen. The oxygen-containing reagent is preferably pure molecular diatomic oxygen, but can also be a mixture of oxygen and inactive gas, for example, nitrogen or argon.

A preferred oxygen-containing reagent is air.

The noble metal precursor employed in the ALD type processes may be solid, liquid or gaseous material, provided that the metal precursor is in vapor phase before it is conducted into the reaction chamber and contacted with the substrate surface. "Pulsing" a vaporized precursor onto the substrate means that the precursor vapor is conducted into the chamber for a limited period of time. Typically, the pulsing time is from about 0.05 to 10 seconds. However, depending on the substrate type and its surface area, the pulsing time may be even higher than 10 seconds. Preferably, for a 300 mm wafer in a single wafer ALD reactor, the noble metal precursor is pulsed for from 0.05 to 10 seconds, more preferably for from 0.5 to 3 seconds and most preferably for about 0.5 to 1.0 seconds. The oxygen-containing precursor is preferably pulsed for from about 0.05 to 10 seconds, more preferably for from 1 to 5 seconds, most preferably about for from 2 to 3 seconds. Pulsing times can be on the order of minutes in some cases. The optimum pulsing time can be readily determined by the skilled artisan based on the particular circumstances.

The mass flow rate of the noble metal precursor can be determined by the skilled artisan. In one embodiment, for deposition on 300 mm wafers the flow rate of noble metal precursor is preferably between about 1 and 1000 sccm without limitation, more preferably between about 100 and 500 sccm. The mass flow rate of the noble metal precursor is usually lower than the mass flow rate of oxygen, which is usually between about 10 and 10000 sccm without limitation, more preferably between about 100-2000 sccm and most preferably between 100-1000 sccm.

Purging the reaction chamber means that gaseous precursors and/or gaseous byproducts formed in the reaction between the precursors are removed from the reaction chamber, such as by evacuating the chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds.

The pressure in the reaction space is typically between about 0.01 and 20 mbar, more preferably between about 1 and 10 mbar.

Before starting the deposition of the film, the substrate is typically heated to a suitable growth temperature. Preferably, the growth temperature of the metal thin film is between about 150° C. and about 450° C., more preferably between about 200° C. and about 400° C. The preferred deposition temperature may vary depending on a number of factors such as, and without limitation, the reactant precursors, the pressure, flow rate, the arrangement of the reactor, and the composition of the substrate including the nature of the material to be deposited on and the nature of the material on which deposition is to be avoided. The specific growth temperature may be selected by the skilled artisan using routine experimentation in view of the present disclosure to maximize the selectivity of the process.

The processing time depends on the thickness of the layer to be produced and the growth rate of the film. In ALD, the growth rate of a thin film is determined as thickness increase per one cycle. One cycle consists of the pulsing and purging steps of the precursors and the duration of one cycle is typically between about 0.2 and 30 seconds, more preferably between about 1 and 10 seconds, but it can be on order of minutes or more in some cases.

Examples of suitable reactors that may be used for the deposition of thin films according to the processes of the present invention include commercially available ALD equipment such as the F-120® reactor, Pulsar® reactor and EmerALD™ reactor, available from ASM America, Inc of Phoenix, Ariz. In addition to these ALD reactors, many other kinds of reactors capable of ALD growth of thin films, including CVD reactors equipped with appropriate equipment and means for pulsing the precursors, can be employed for carrying out the processes of the present invention. Preferably, reactants are kept separate until reaching the reaction chamber, such that shared lines for the precursors are minimized. However, other arrangements are possible, such as the use of a pre-reaction chamber as described in U.S. application Ser. Nos. 10/929,348, filed Aug. 30, 2004 and 09/836,674, filed Apr. 16, 2001, incorporated herein by reference.

The growth processes can optionally be carried out in a reactor or reaction space connected to a cluster tool. In a cluster tool, because each reaction space is dedicated to one type of process, the temperature of the reaction space in each module can be kept constant, which clearly improves the throughput compared to a reactor in which is the substrate is heated up to the process temperature before each run.

Formation of Gate Electrodes Using Selective Deposition

The ability to deposit on a first surface, such as a high-k material, while avoiding deposition on a second surface, such as a silicon oxide or a silicon nitride surface, can be utilized in the formation of a gate electrode.

Several embodiments are illustrated in FIGS. 1 through 21. Other processes that take advantage of the ability to selectively deposit noble metals will be apparent to the skilled artisan.

Figure 2:
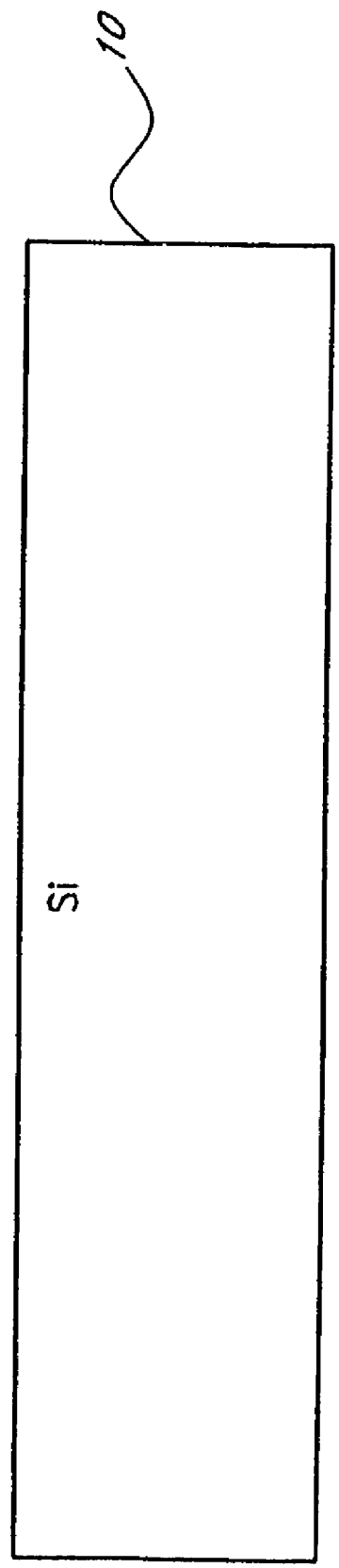
Figure 3:
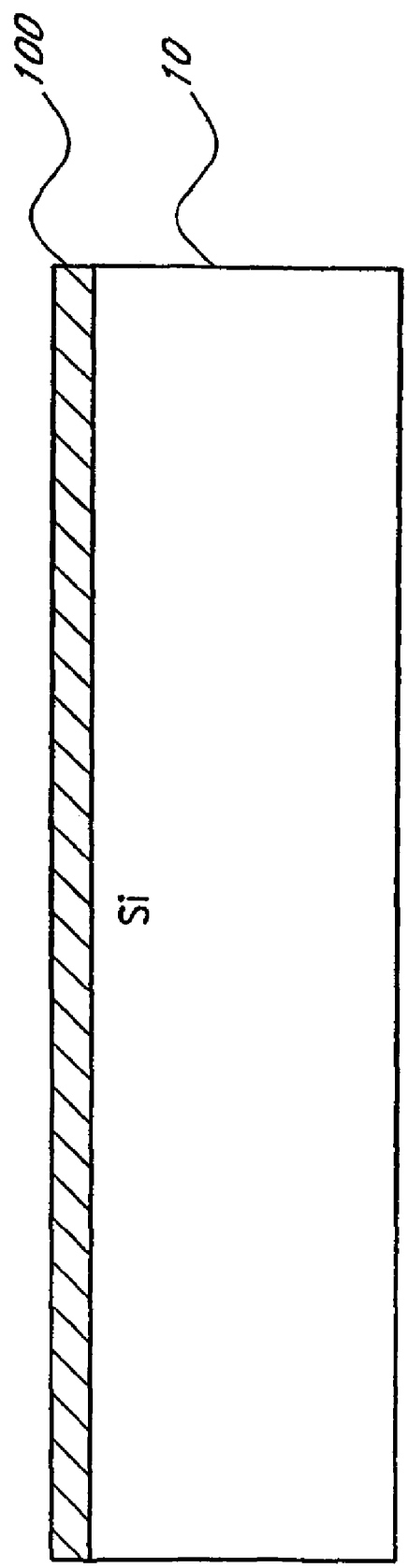

In FIG. 1, a silicon substrate 10 is illustrated comprising a layer of native oxide 50. The native oxide 50 is removed by etching, leaving the bare substrate 10 as shown in FIG. 2. The surface of the substrate is then prepared for deposition of a high-k layer by ALD, such as by the deposition of a thin interfacial layer. For example, a thin chemical oxide or oxynitride may be formed on the surface. In other embodiments a thermal oxide is grown on the substrate. In one embodiment the thin interfacial layer is from about 2 to about 15 angstroms thick. FIG. 3 illustrates a thin layer interfacial layer 100 of Silicon oxide grown over the substrate 10.

Figure 4:
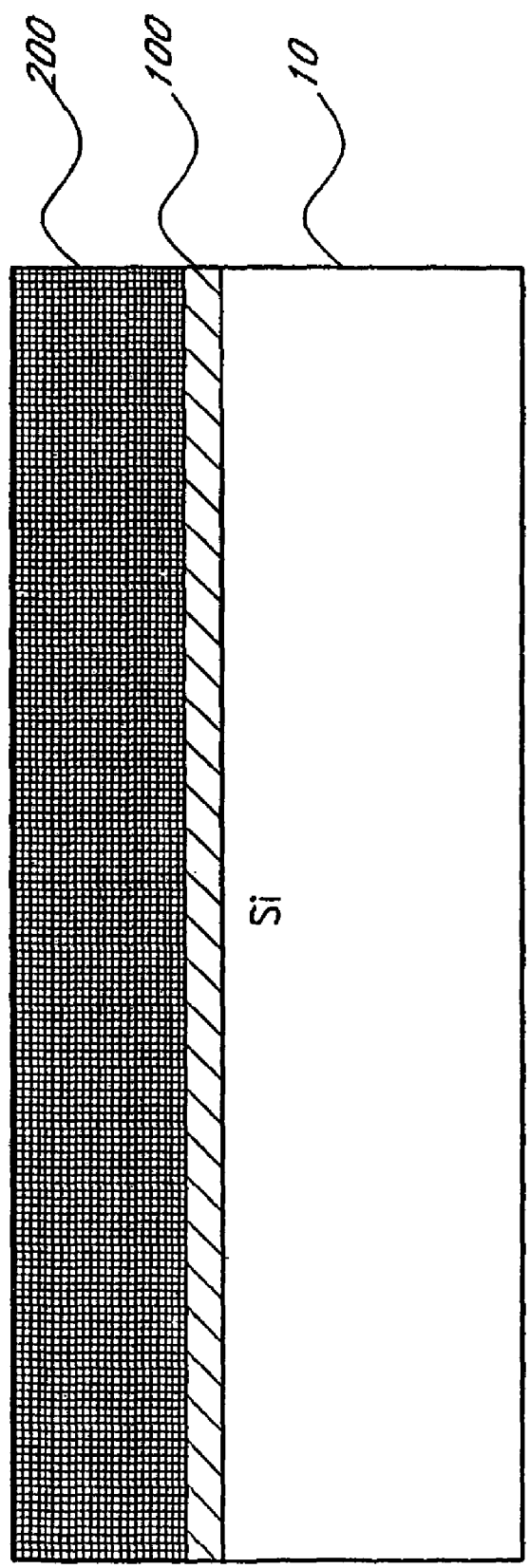
Figure 5:
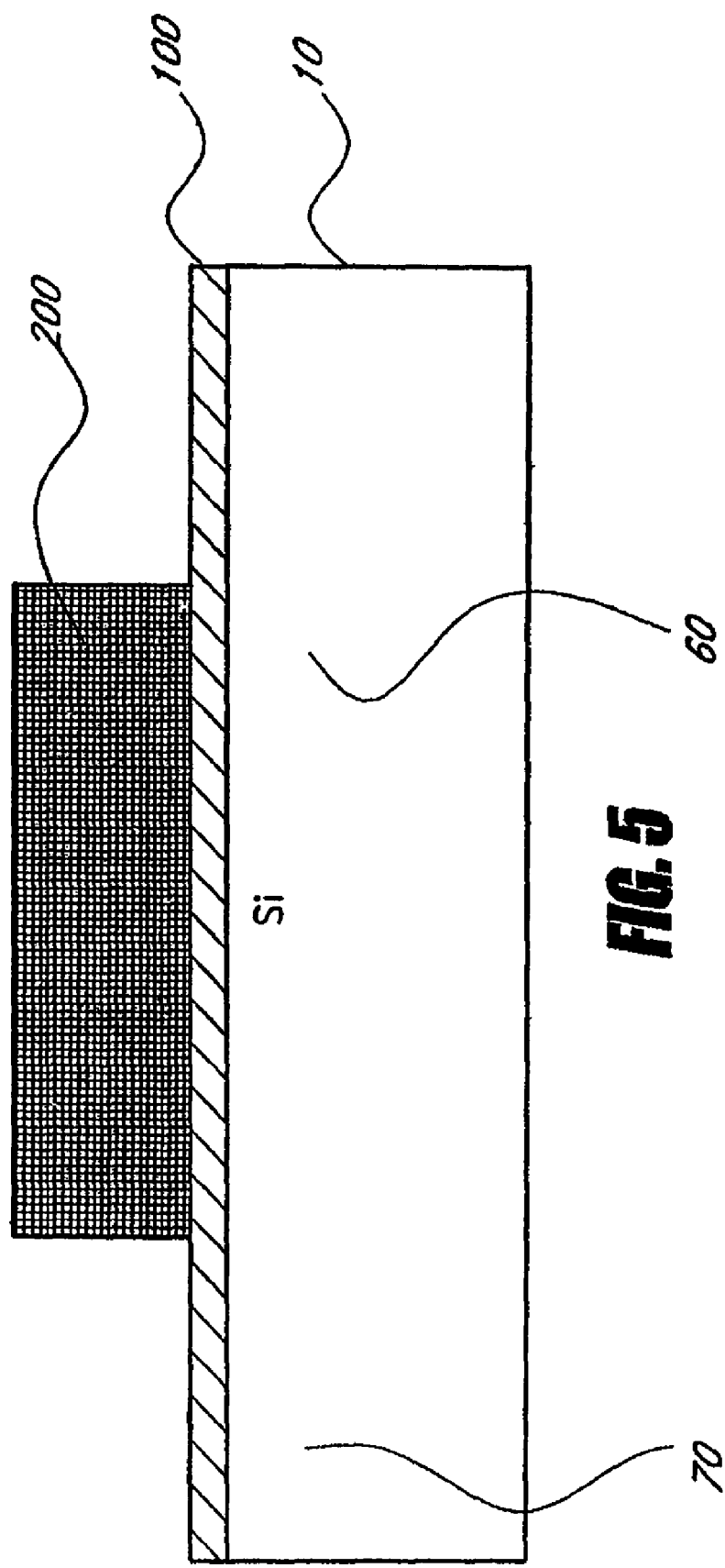
Figure 6:
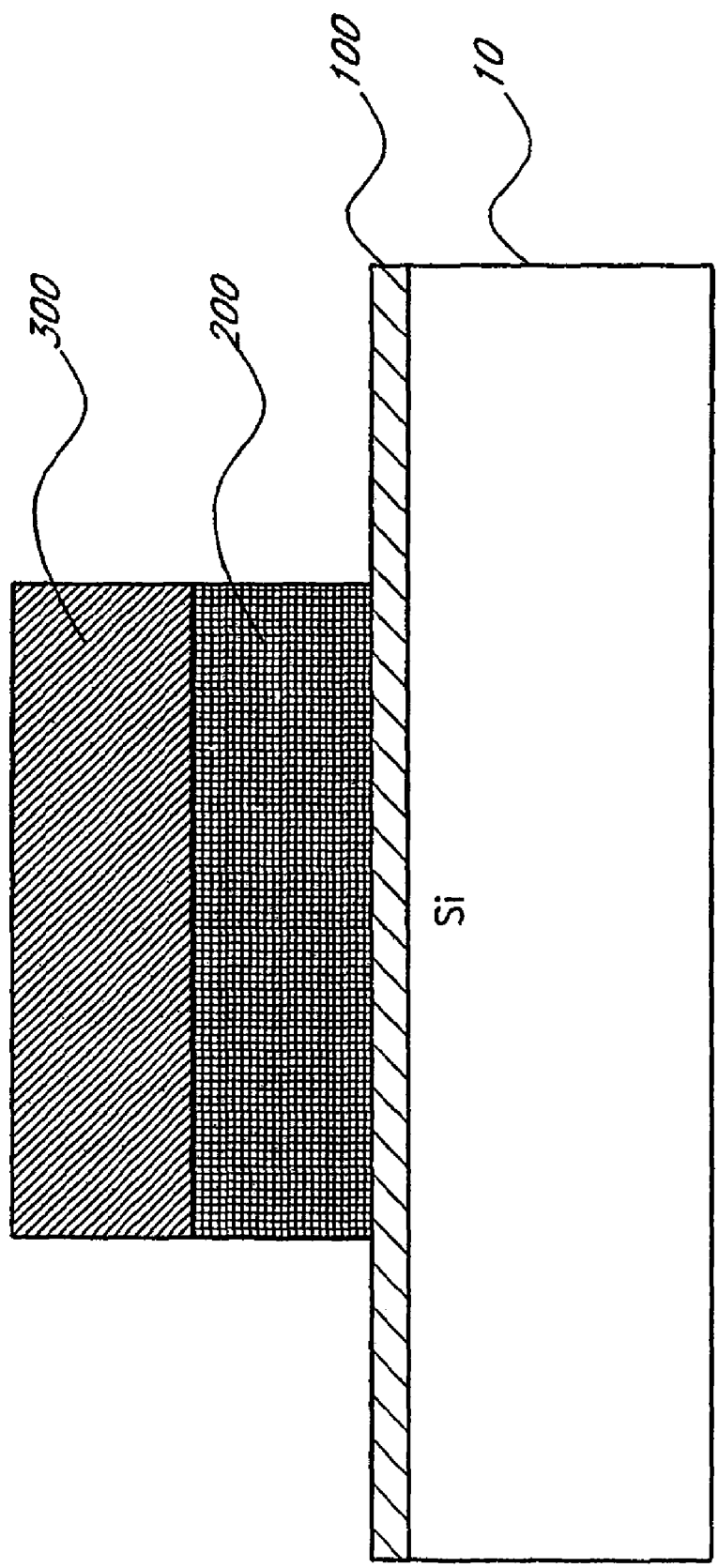

A thin layer of high-k material 200 is subsequently deposited over the interfacial layer 100 to form the structure illustrated in FIG. 4. The high-k material 200 is then patterned such that it remains over the channel region 60 and not over the regions 70 that will become the source and drain, as illustrated in FIG. 5. Finally, a layer of Ru 300 is selectively deposited over the patterned high-k material 200 by a vapor deposition process, preferably ALD, and patterned (if necessary or desired) to form the structure illustrated in FIG. 6.

In some embodiments the Ru forms the gate electrode. In other embodiments (not shown) another conductive material, such as a metal or poly-Si, is deposited over the selectively deposited Ru. In some embodiments the additional conductive material is selectively deposited over the ruthenium to form a gate electrode. The additional conductive material may be patterned, if necessary or desired. Further processing steps, such as spacer deposition and source/drain implantation will be apparent to the skilled artisan.

Figure 7:
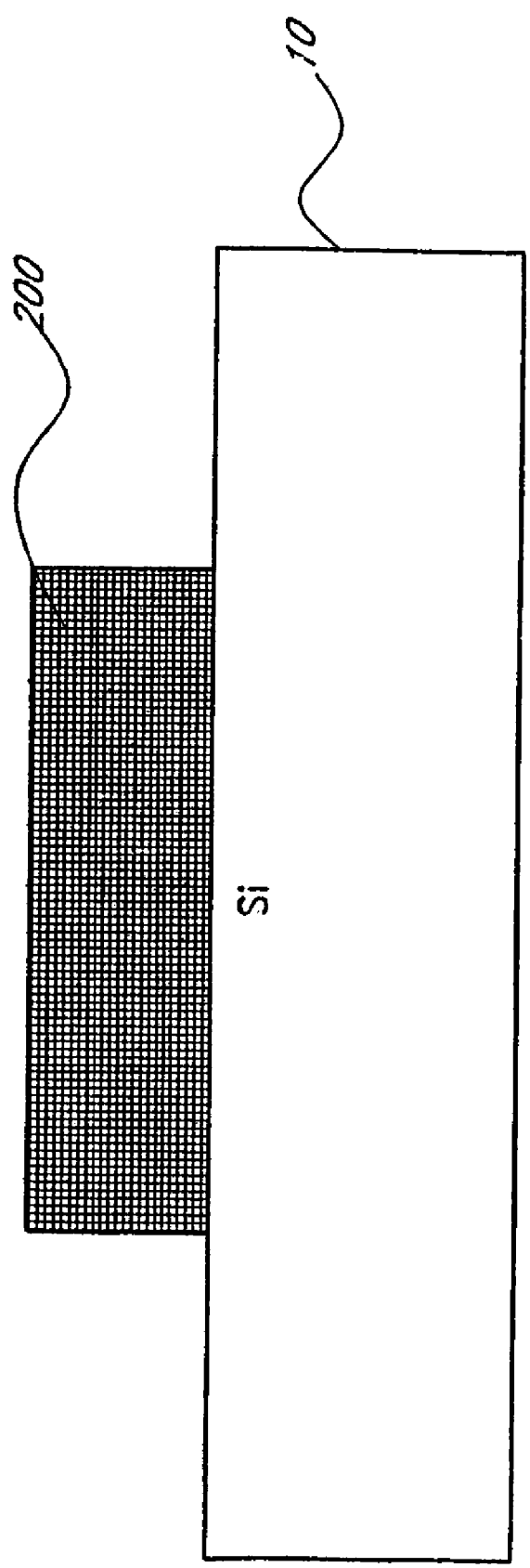
FIGS. 7-9 are schematic cross-sections of partially fabricated integrated circuits, illustrating another process flow for the formation of a gate electrode utilizing a selective noble metal deposition process.
Figure 8:
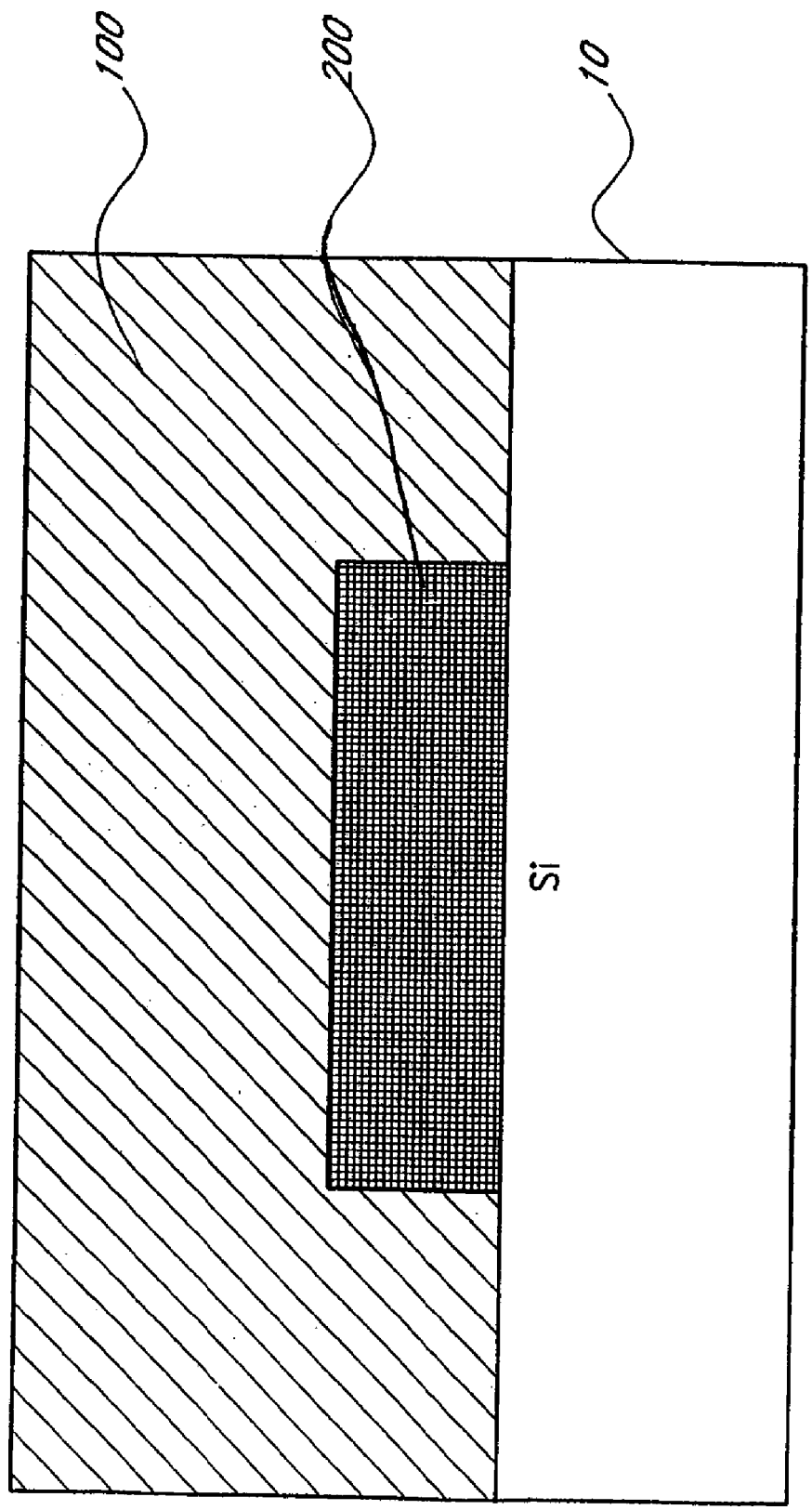
Figure 9:
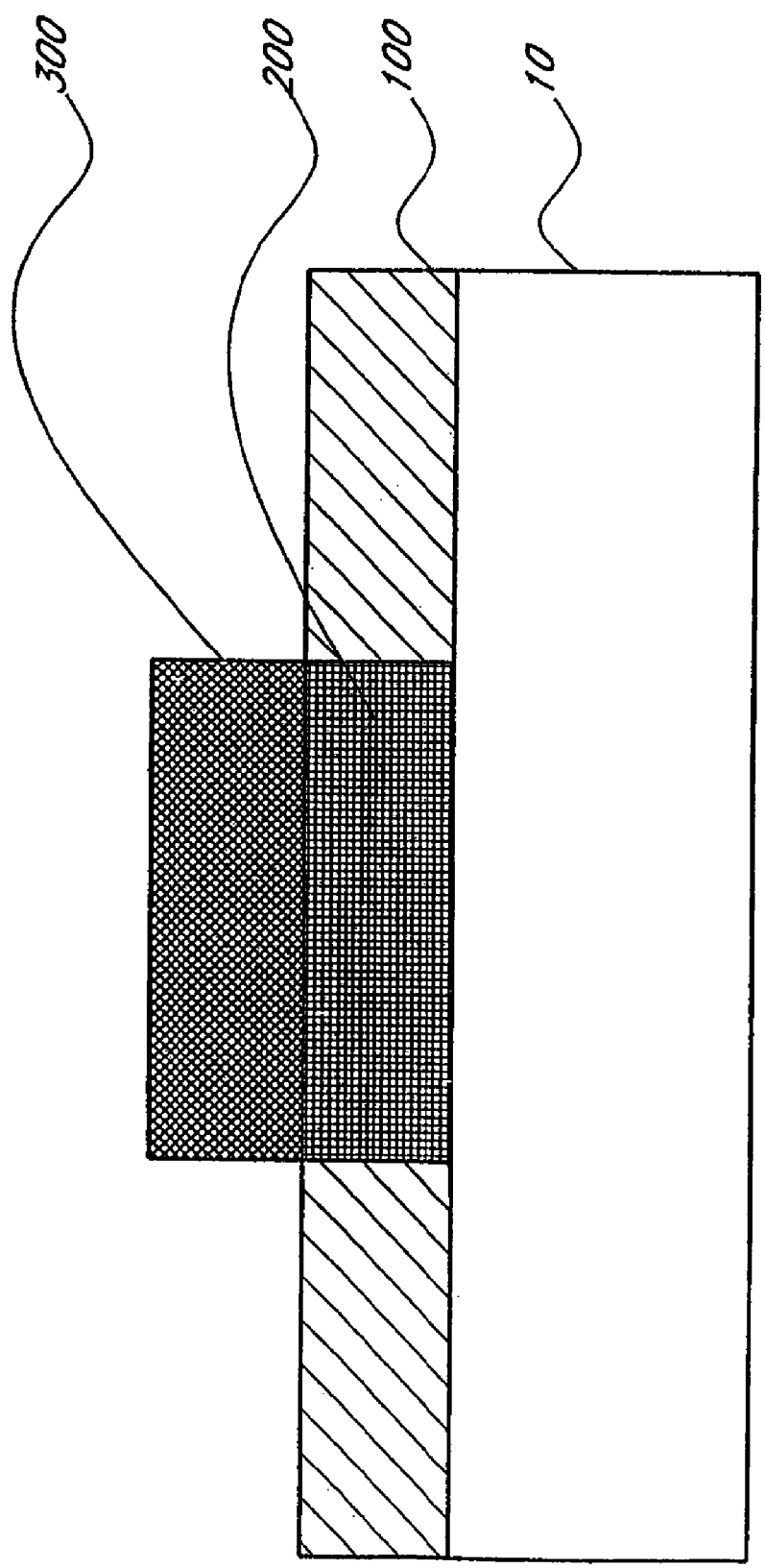

Another process flow is illustrated in FIGS. 7-9. In FIG. 7, a layer of high-k material 200 is deposited over a silicon substrate 10 and patterned. The substrate may have been treated prior to deposition of the high-k material 200. For example, a layer of native oxide may have been removed and the surface treated to facilitate high-k deposition.

A layer of silicon oxide 100 is formed over the substrate 10 and covers the high-k material 200, as illustrated in FIG. 8. The silicon oxide layer 100 is planarized to expose the underlying high-k layer 200. A layer of ruthenium 300 is selectively deposited over the high-k material 200 to form the gate electrode structure shown in FIG. 9. In some embodiments the Ru layer forms the gate electrode, while in other embodiments a further conductive material may be deposited over the Ru and patterned, if necessary or desired, to form the gate electrode.

Figure 10:
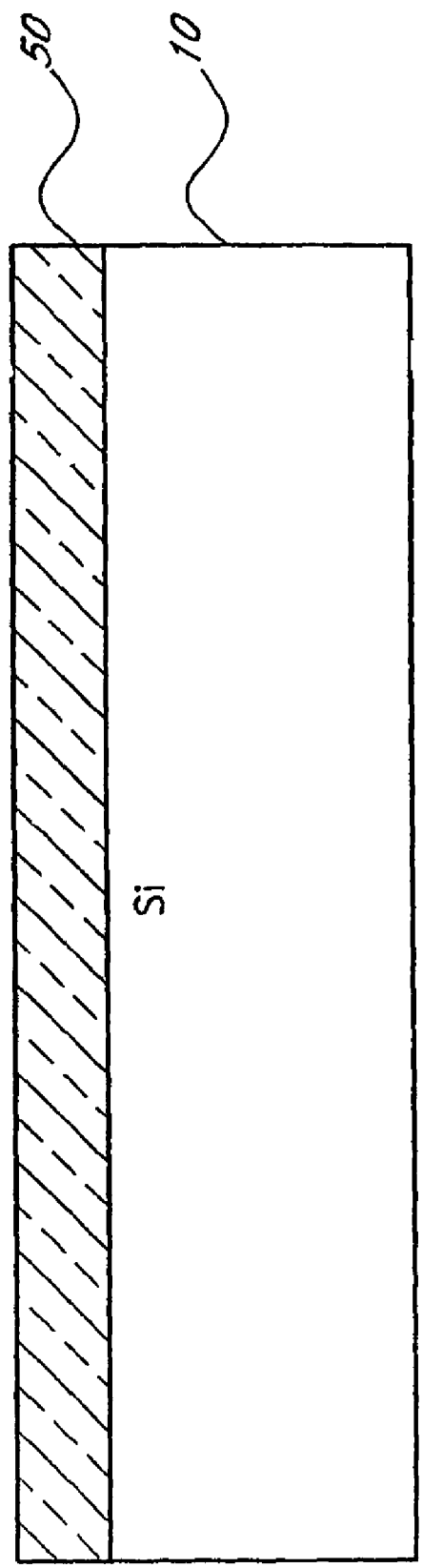
FIGS. 10-16 are schematic cross-sections of partially fabricated integrated circuits, illustrating a gate-last process flow for the formation of a gate electrode utilizing selective noble metal deposition.
Figure 11:
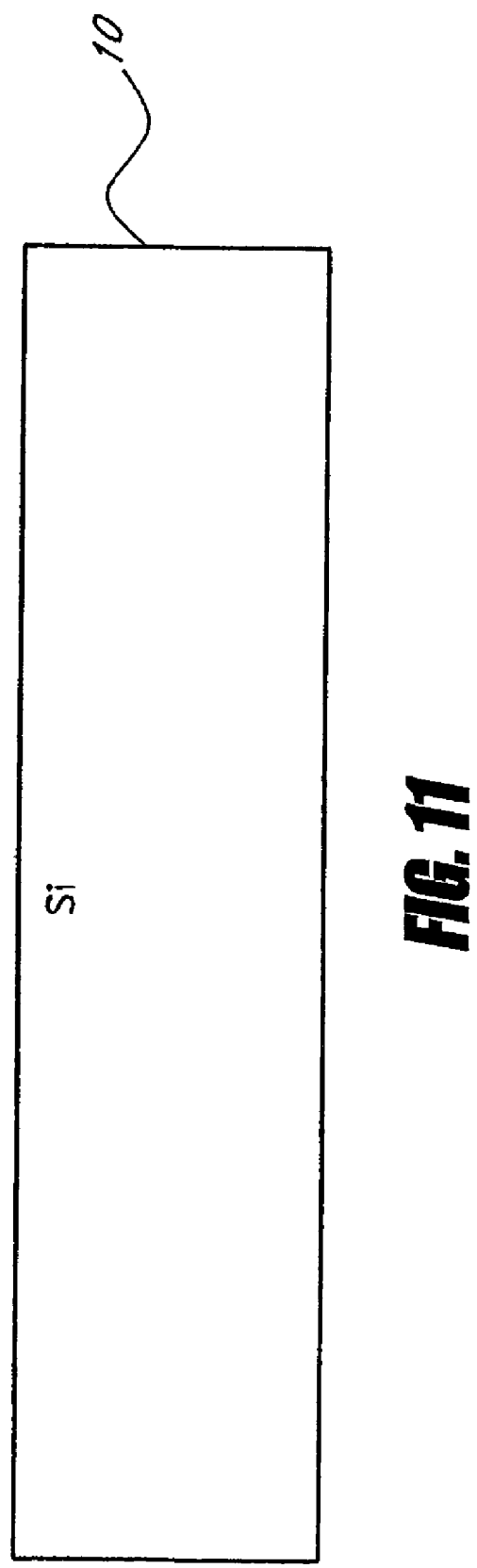
Figure 12:
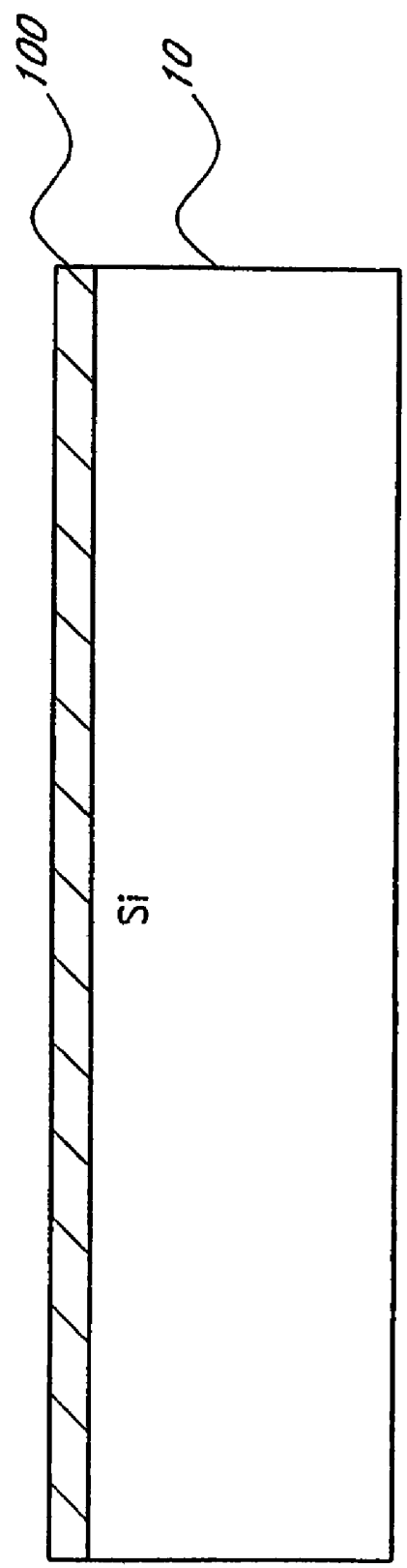
Figure 13:
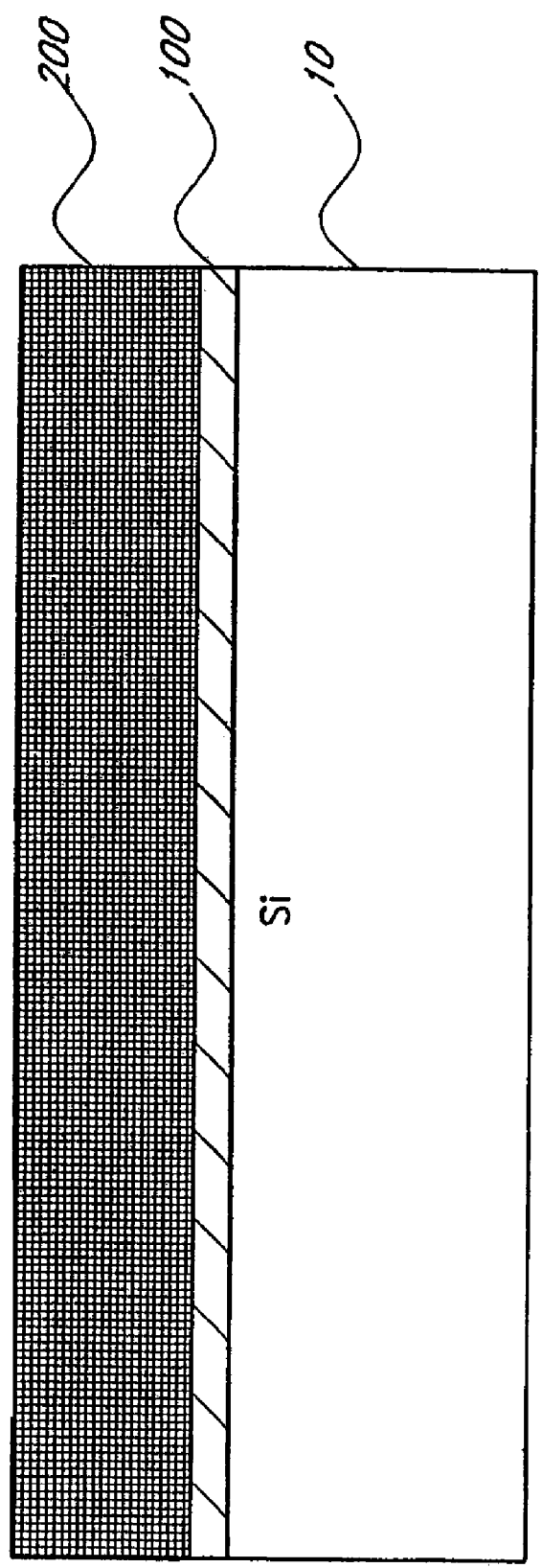
Figure 14:
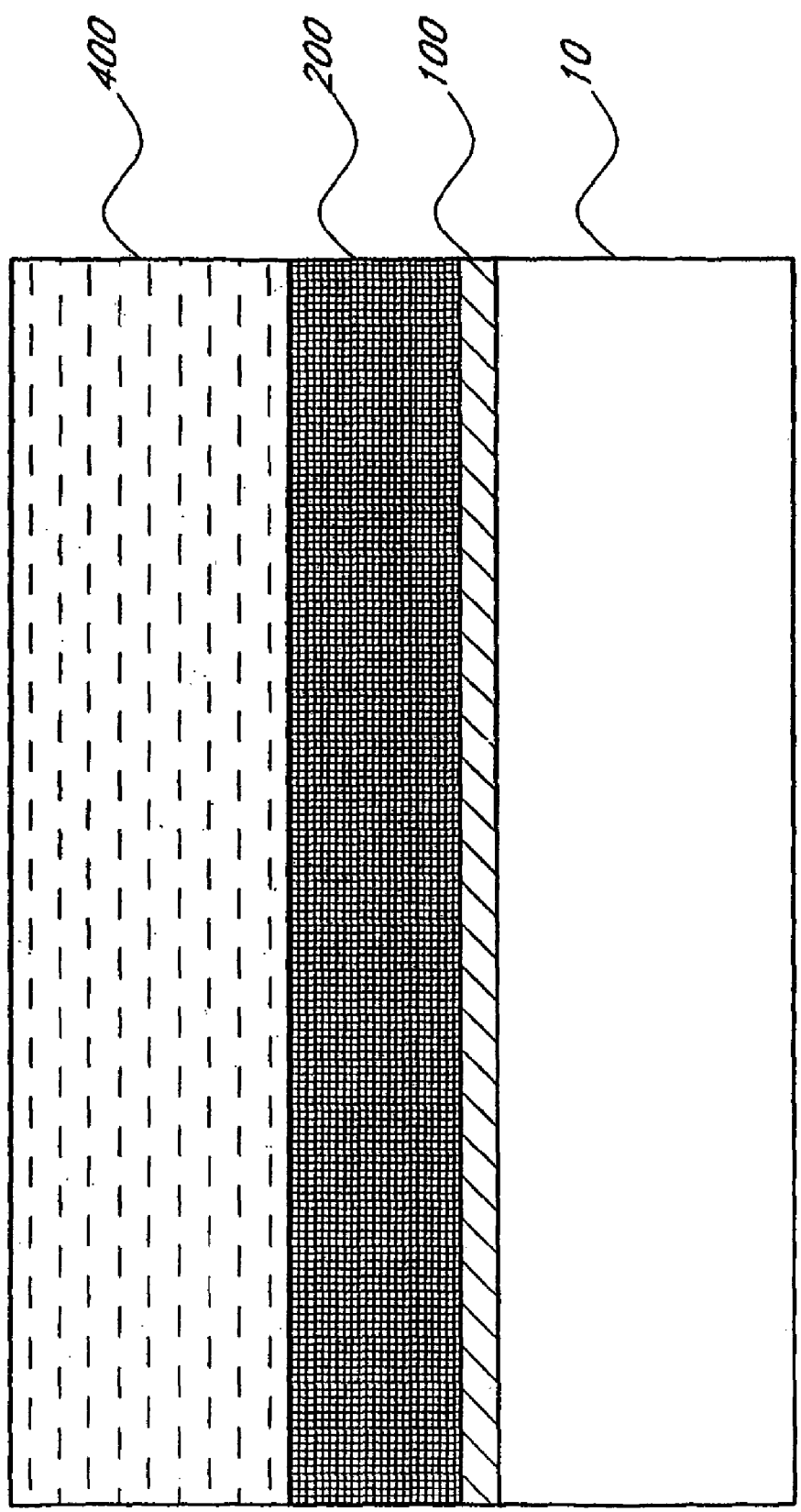
Figure 15:
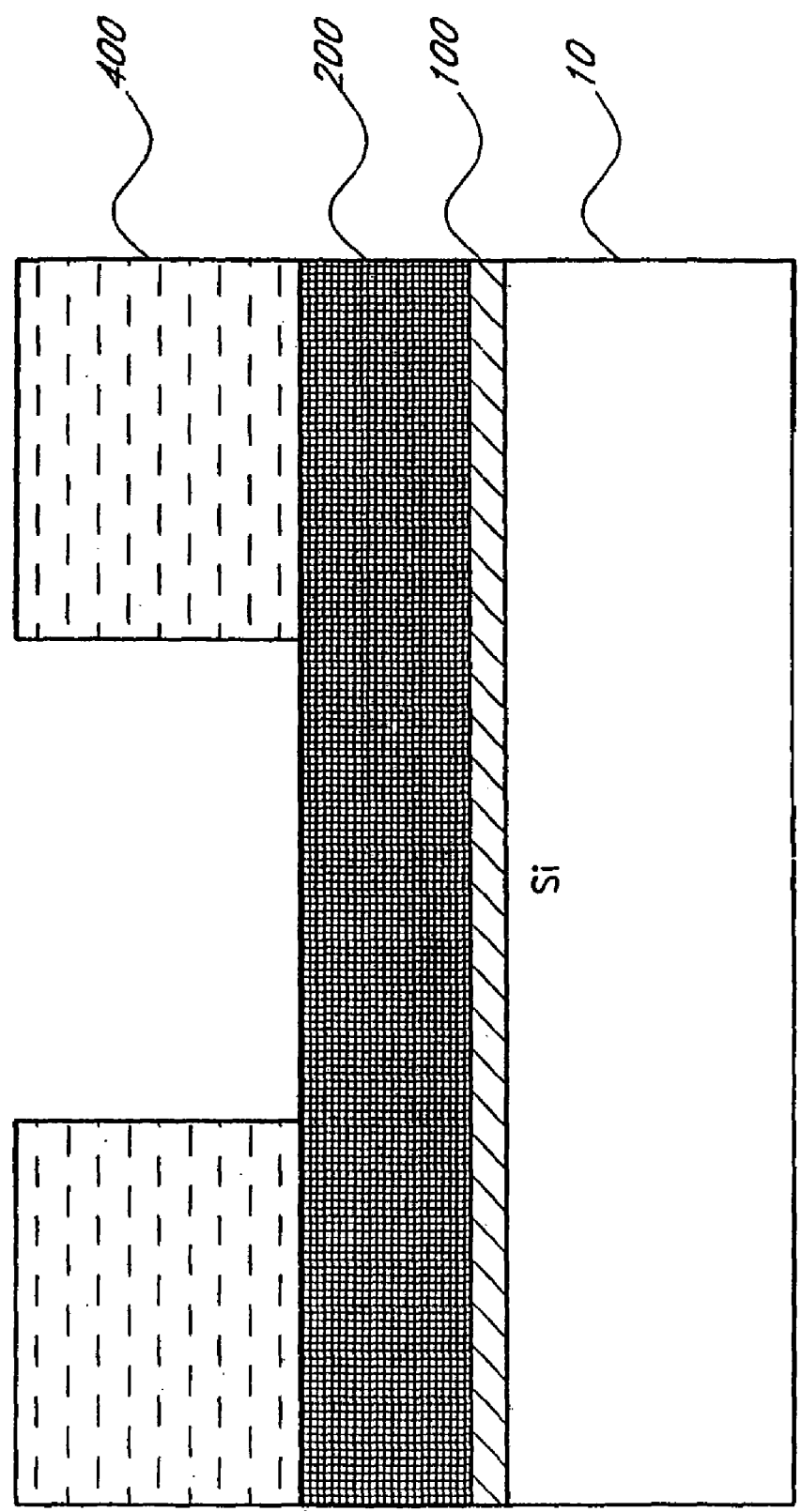
Figure 16A:
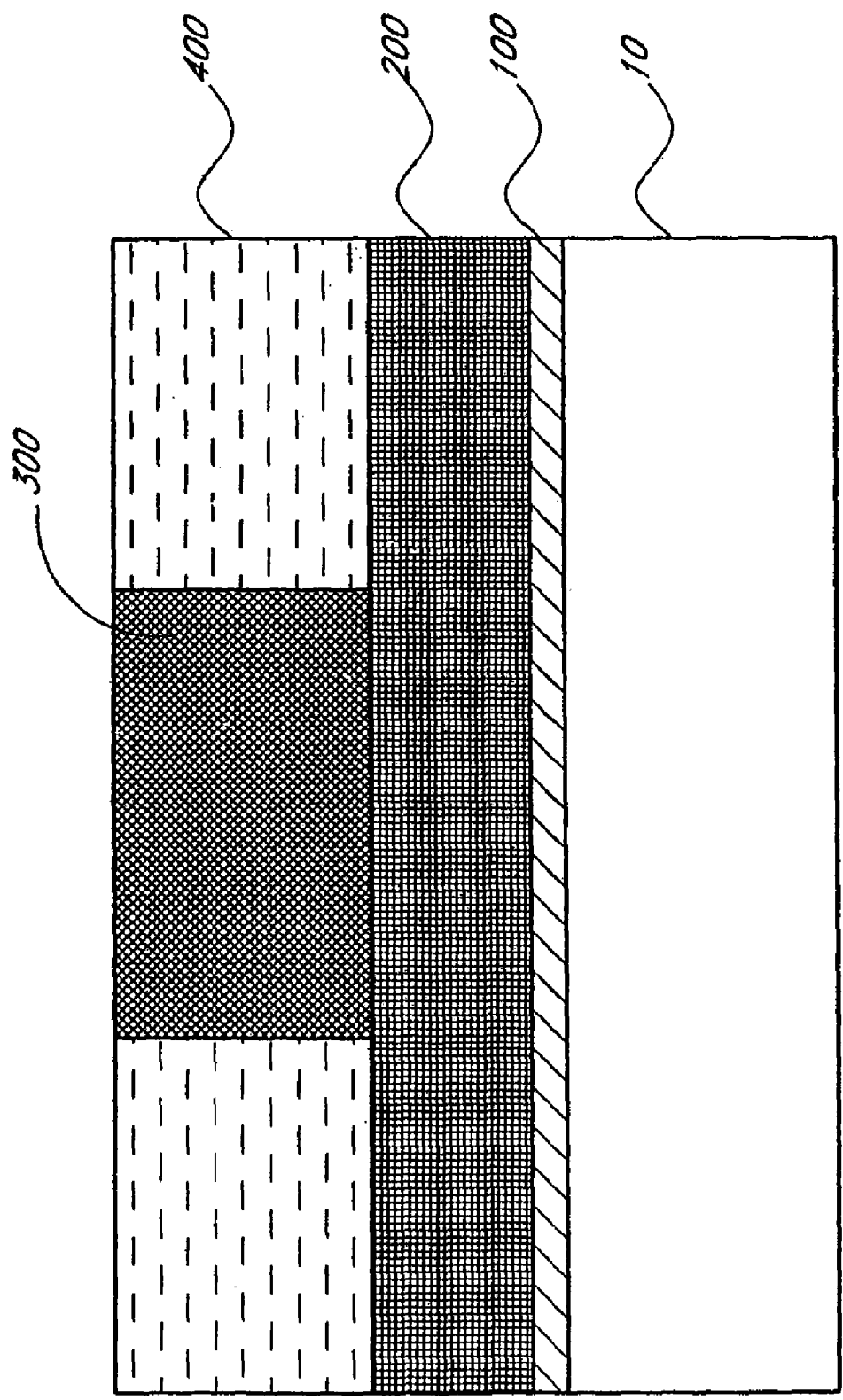

A gate-last approach is illustrated in FIGS. 10-15. FIG. 10 shows a silicon substrate 10 with a layer of native oxide 50. In FIG. 11, the native oxide 50 is removed by etching, leaving the bare silicon substrate 10. A silicon oxide or silicon nitride interface layer 100 with a thickness of about 2-15 Å is formed over the bare substrate 10 to produce the structure illustrated in FIG. 12. A high-k layer 200 is deposited, preferably by ALD, over the interface layer 100 to form the structure of FIG. 13. This is followed by deposition of a silicon oxide layer 400 (FIG. 14). The silicon oxide layer 400 is patterned to expose the underlying high-k layer 200 (FIG. 15). A layer of ruthenium or another noble metal 300 is subsequently deposited selectively over the exposed high-k layer 200 to form a gate electrode as illustrated in FIG. 16A. Further process steps, such as deposition of conductor or contact metals and patterning will be apparent to the skilled artisan.

Figure 16B:
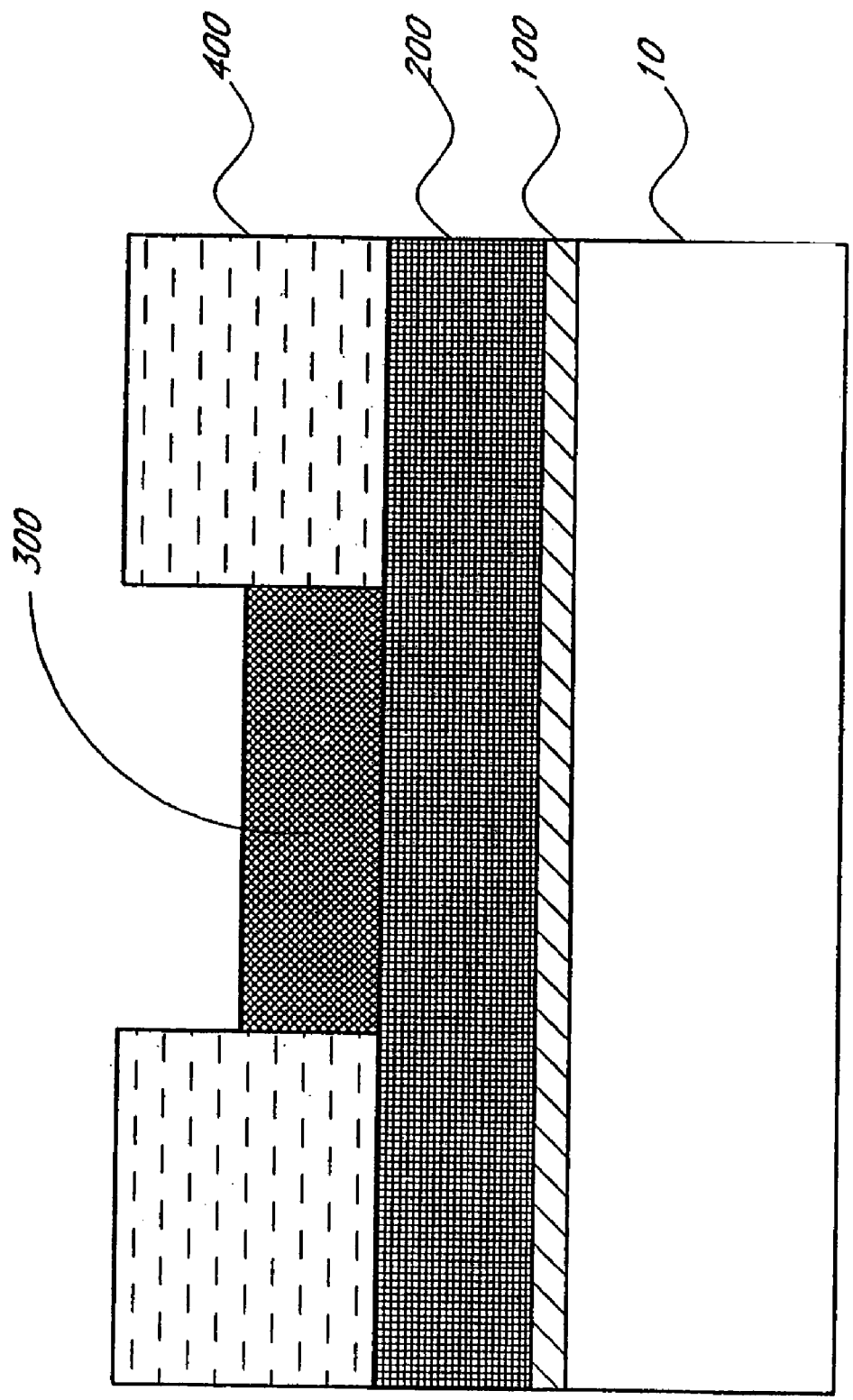
Figure 16C:
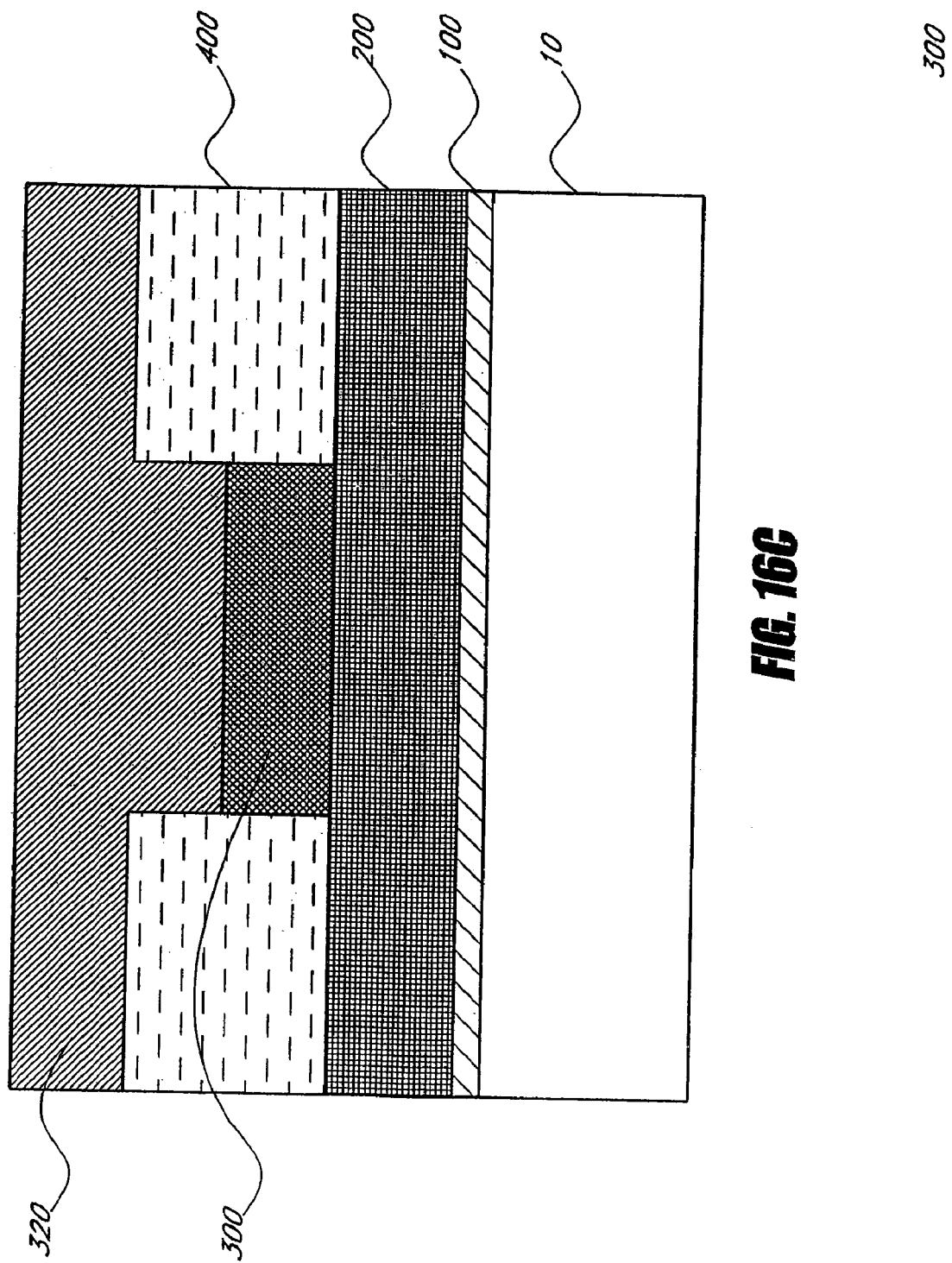

It will be understood by the skilled artisan that the ruthenium layer 300 need not fill the space over the high-k layer 200. That is, in some embodiments the ruthenium layer 300 may not reach the upper surface of the silicon oxide layer 400 as illustrated in FIG. 16B. In a further step, a conductor 320 is deposited over the ruthenium layer 300 (FIG. 16C). The conductor is subsequently polished or otherwise etched back to form the gate electrode (not shown).

Figure 17:
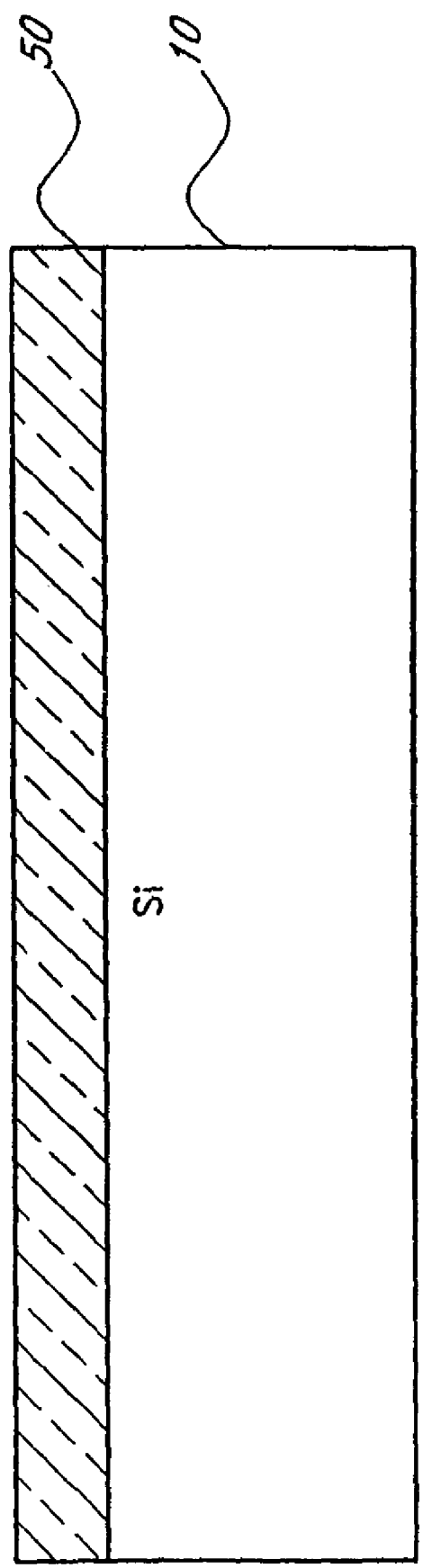
FIGS. 17-23 are schematic cross-sections of partially fabricated integrated circuits, illustrating another gate-last process flow for the formation of a gate electrode utilizing selective noble metal deposition.
Figure 18:
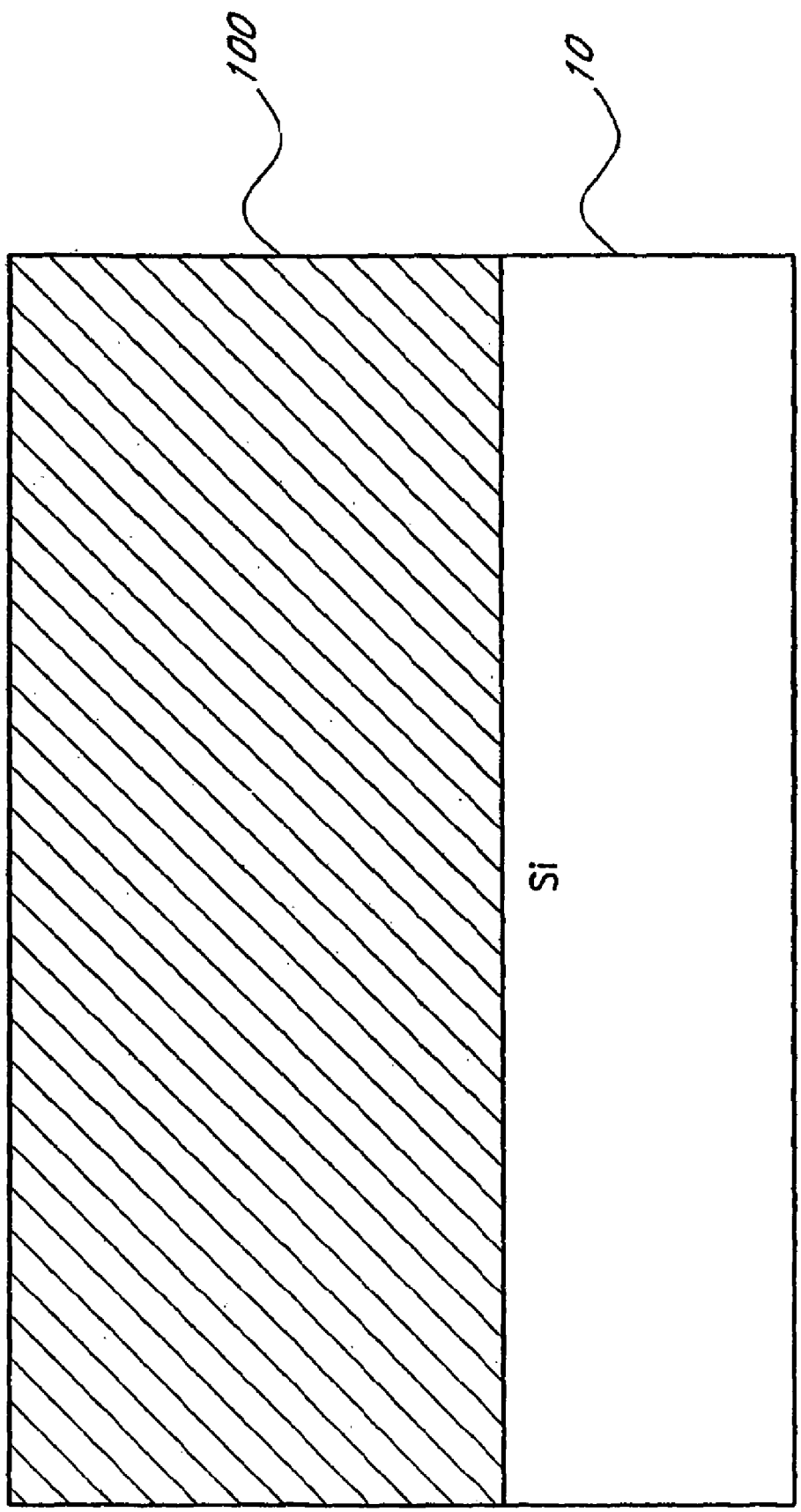
Figure 19:
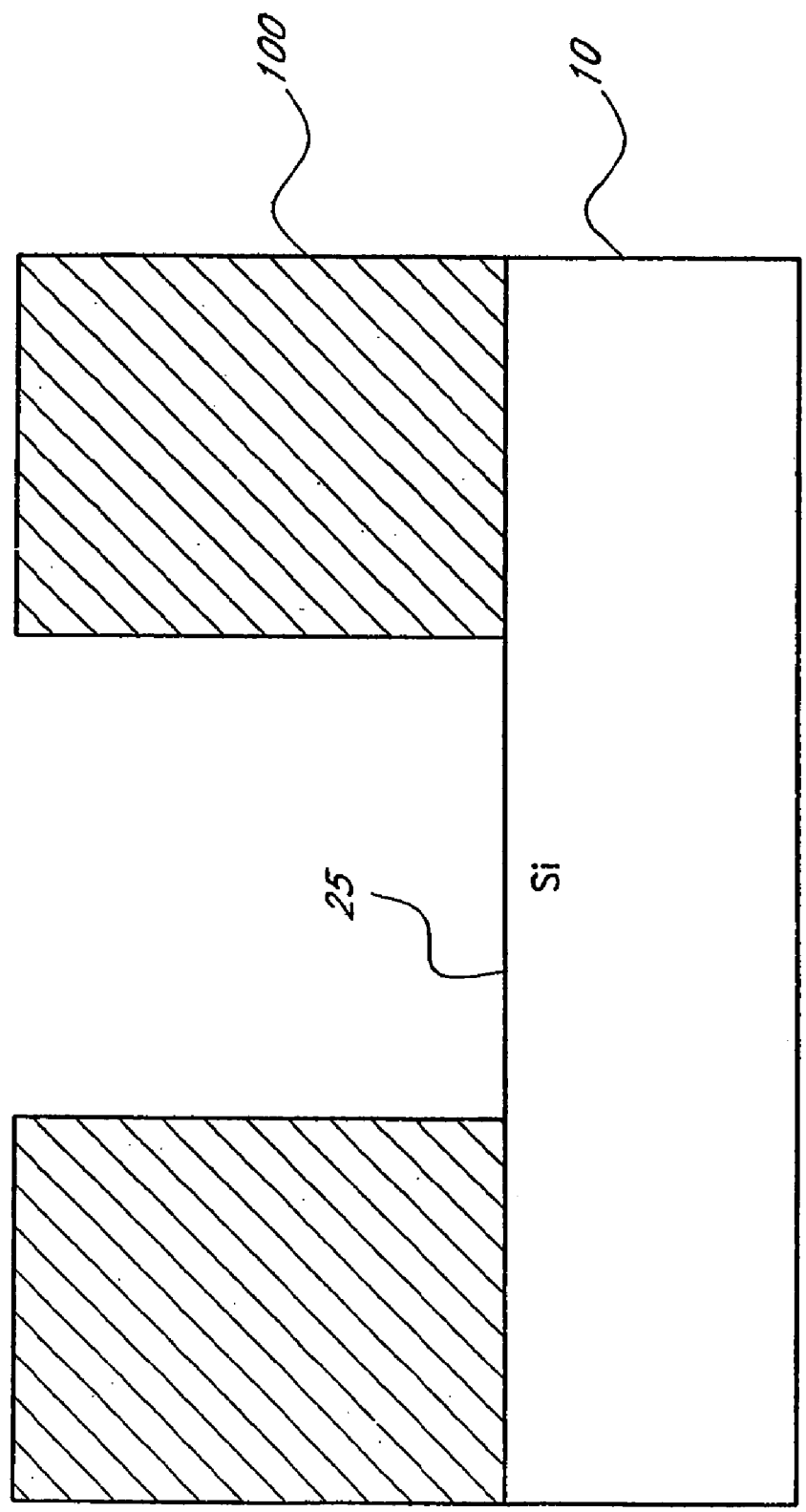
Figure 20:
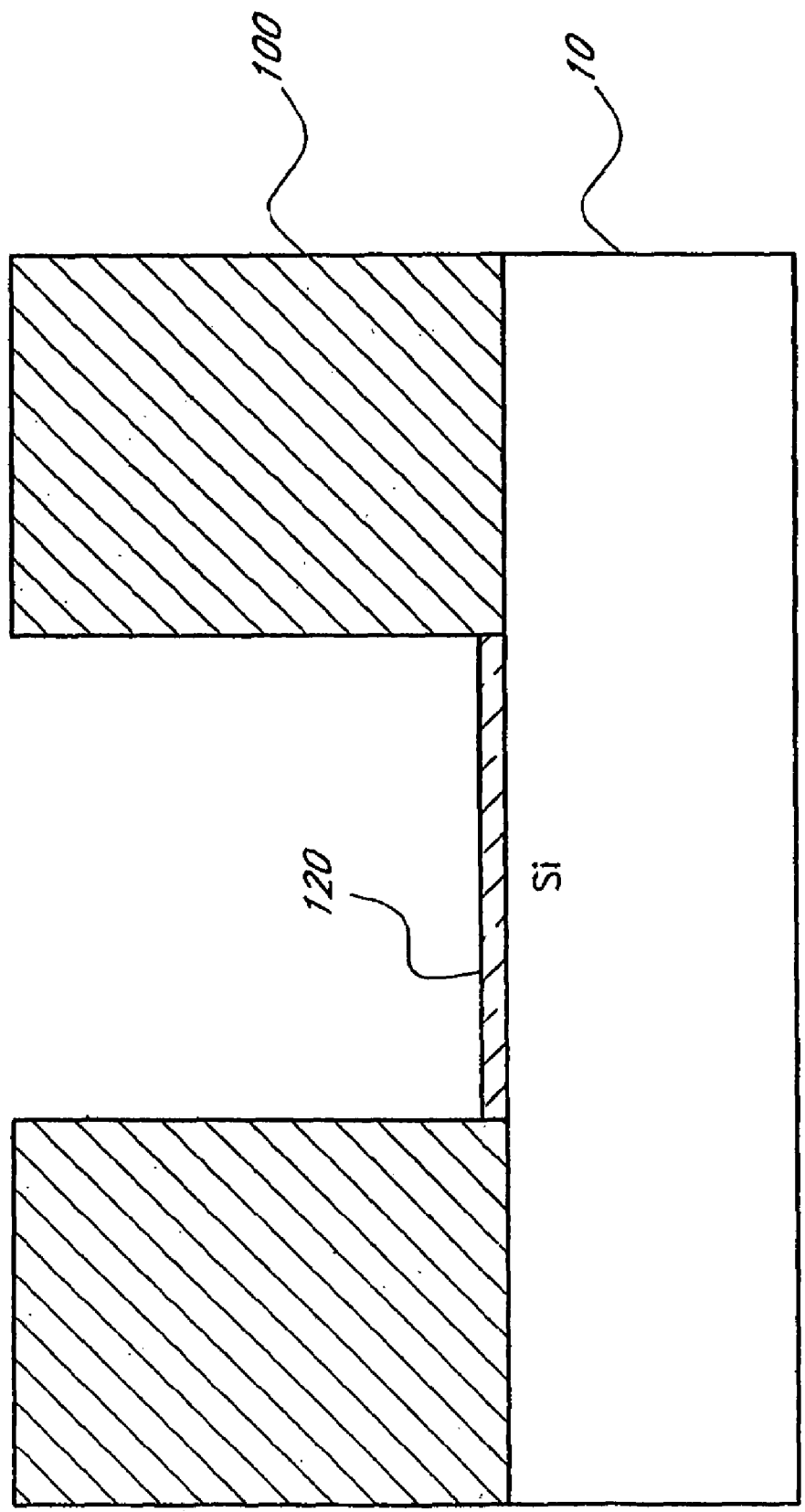
Figure 21:
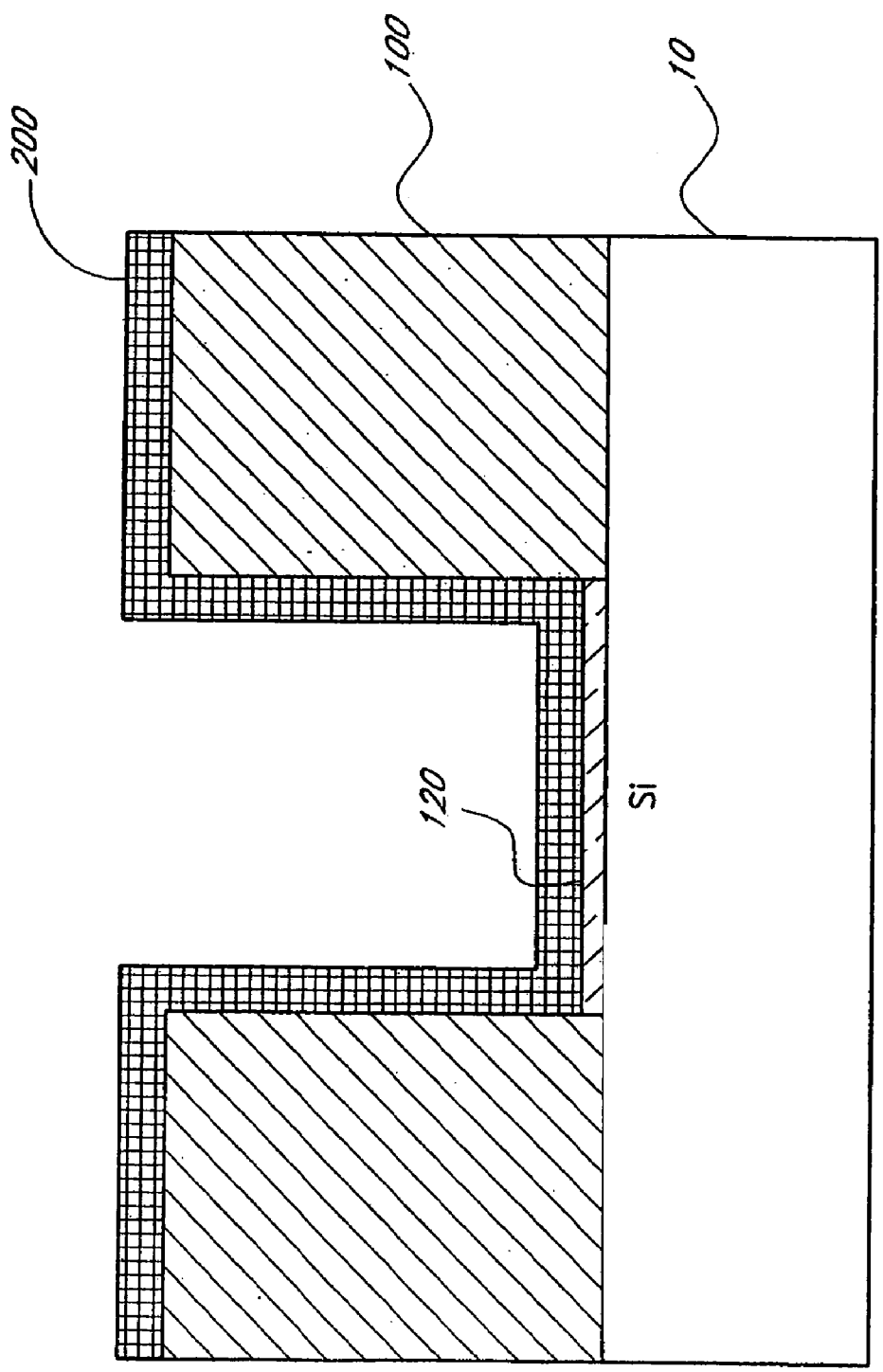

In another gate last approach a silicon substrate 10 covered with native oxide 50 is provided (FIG. 17). The native oxide 50 is optionally removed, followed by deposition of a layer of silicon oxide 100 over the substrate as shown in FIG. 18. The silicon oxide layer 100 is etched to form a trench and the exposed surface 25 (FIG. 19) is prepared for deposition of a high-k dielectric layer by pretreatment or deposition of an interfacial layer 120 as shown in FIG. 20. The interfacial layer 120 may comprise, for example, a thermally or chemically grown ultrathin silicon oxide or silicon nitride. A high-k layer 200 is then deposited by a vapor deposition process, preferably by an ALD process, over the entire structure (FIG. 21).

Figure 22:
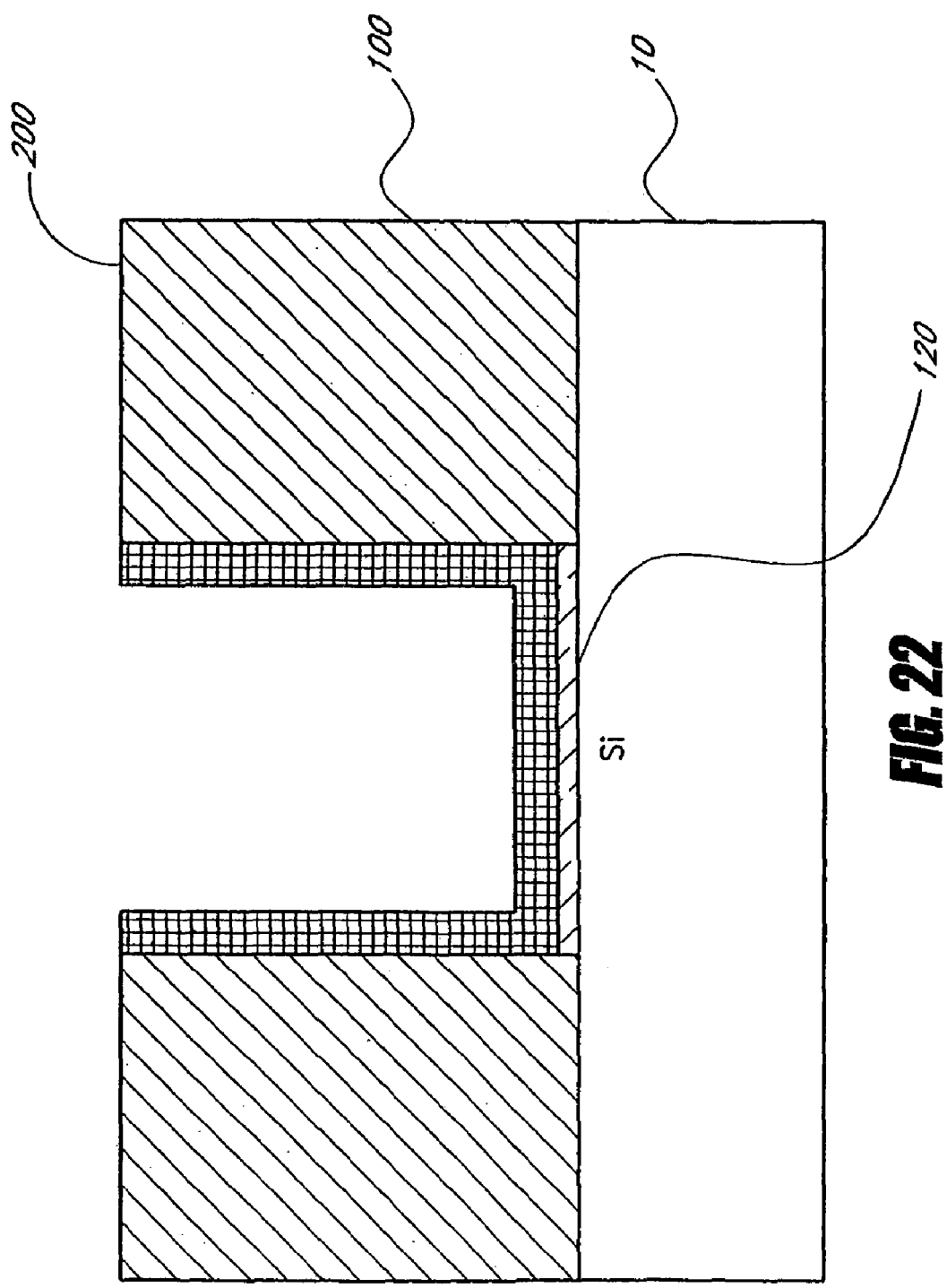
Figure 23:
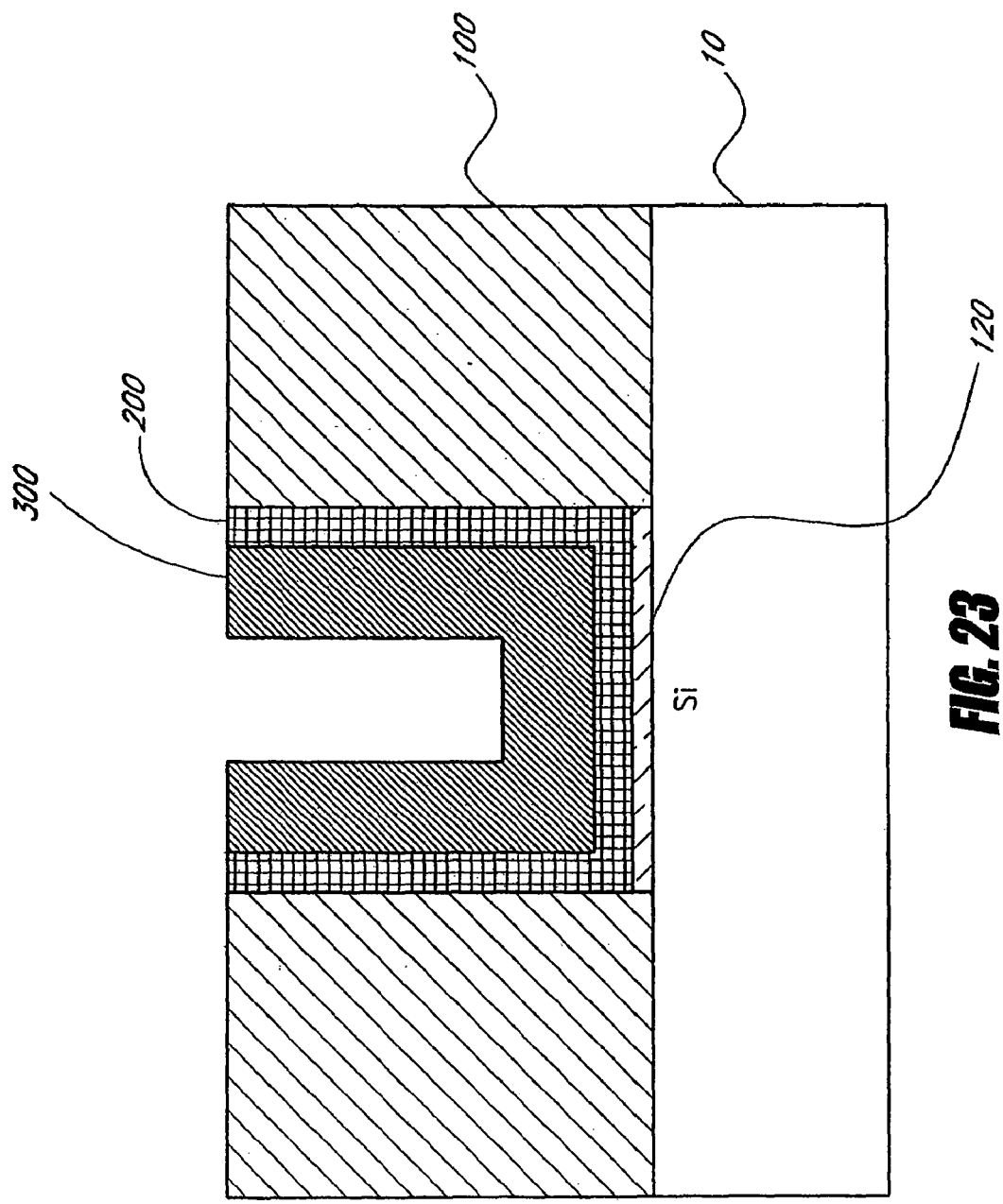

The high-k material is removed from over the silicon oxide 100 to produce the structure illustrated in FIG. 22. This may be accomplished, for example, by filling the space over the interface layer 120 with a resist material, planarizing or otherwise etching back the resulting structure down to the top of the silicon oxide layer 100 and removing the resist material (not shown). Finally, a ruthenium layer 300 is selectively deposited over the high-k layer 200 by atomic layer deposition (FIG. 23).

In each of the illustrated embodiments, additional processing is performed to produce the desired integrated circuit, as will be apparent to the skilled artisan.

Because ruthenium selectively deposits on the high-k material and not on the silicon oxide or oxynitride, it is not necessary to mask the oxide prior to deposition of the gate electrode material in each of these process flows. However, if necessary noble metal deposition can be followed with a short wet etch or other clean up process to ensure removal of any small amount of noble metal or noble metal compound left on the low k insulator, such as if there is less than perfect selectivity. The process flows can also save valuable and expensive materials and, depending on the particular circumstances, can avoid the sometimes difficult etching of noble metals or noble metal compounds.

As mentioned above, the ruthenium may form the entire gate electrode. However, in some embodiments the gate electrode comprises a further conductive material such as a metal or poly-silicon that has been deposited on the ruthenium. The additional conductive material may be deposited by ALD or by another deposition process, such as by CVD or PVD. The deposition may be selective, or may be followed by patterning steps. Preferably, the high-k material is also deposited by an ALD process.

The high-k material preferably has a k value of greater than or equal to 5, more preferably greater than or equal to 10, and even more preferably greater than or equal to 20. Exemplary high-k materials include $HfO_2$, $ZrO_2$, $Al_2O_3$, $TiO_2$, $Ta_2O_5$, $Sc_2O_3$, lanthanide oxides and mixtures thereof, and complex oxides such as silicates, yttria-stabilized zirconia (YSZ), barium strontium titanate (BST), strontium titanate (ST), strontium bismuth tantalate (SBT) and bismuth tantalate (BT).

The following non-limiting examples will illustrate the invention in more detail.

Example 1

Ruthenium thin films were deposited on 300 mm wafers with various materials formed thereover from alternating pulses of bis(ethylcyclopentadienyl)ruthenium ($Ru(EtCp)_2$) and oxygen ($O_2$) at a temperature of about 370° C.

The pulse length of the evaporated ruthenium precursor was about 0.7 seconds and was followed by a purge with an inert gas that lasted from about 2 seconds. The pulse length of the oxygen-containing reactant was about 2 seconds and the purge thereafter was about 2 seconds.

Ruthenium was found to grow using this process on TaN, $Al_2O_3$, Ta and $HfO_2$ surfaces. The typical growth rate was about from 0.5 to 0.9 Å/cycle on these surfaces, not counting incubation time. The incubation time for Ru growth was found to be about 50-100 cycles on TaN, 50-100 cycles on $Al_2O_3$, about 50 cycles on Ta and virtually zero on $HfO_2$.

However, even 450 cycles of the same Ru process did not produce a measurable and conductive film on a thermal silicon oxide surface produced by a wet oxide process.

Where deposition was observed, the rate was independent of the Ru(EtCp)$_2$ dose, indicating that film growth proceeded in the self-limiting manner that is characteristic of ALD.

Although the foregoing invention has been described in terms of certain preferred embodiments, other embodiments will be apparent to those of ordinary skill in the art. Moreover, although illustrated in connection with particular process flows and structures, the skilled artisan will appreciate variations of such schemes for which the methods disclosed herein will have utility. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

We claim:

1. A method for selectively depositing a thin film comprising one or more noble metals on a substrate comprising a first surface and a second surface, the method comprising:
    contacting the first and second surface of the substrate with a gaseous noble metal precursor;
    providing a second reactant gas pulse to the reaction chamber; and
    repeating until a thin film of a desired thickness is obtained selectively on the first surface relative to the second surface,
    wherein the first surface comprises a material selected from the group consisting of metals, metal nitrides, metal carbides, metal borides, conductive oxides and mixtures thereof; and
    wherein the second surface comprises a material selected from the group consisting of silicon oxides, silicon nitrides, silicon oxynitrides, fluorinated silica glass (FSG), carbon doped silicon oxide (SiOC) and materials containing more than about 50% silicon oxide and wherein the temperature is below about 400° C.

2. The process of claim 1, additionally comprising removing excess noble metal precursors from the reaction chamber after contacting the substrate with the noble metal precursor and prior to providing the second reactant gas pulse.

3. The process of claim 1, wherein the thin film is not formed on the second surface.

4. The process of claim 1, wherein the thin film that is obtained is thicker on the first surface than on the second surface.

5. The process of claim 1, wherein the second surface is SiO$_2$.

6. The process of claim 1, wherein the second surface is silicon oxynitride.

7. The process of claim 1, wherein the noble metal is ruthenium.

8. The process of claim 7, wherein the noble metal precursor is Ru(EtCp)$_2$.

9. The process of claim 1, wherein the first surface comprises a material selected from the group consisting of Ta, TaN, TaC$_x$, TaB$_x$, Ti, TiN, TiC$_x$, TiB$_x$, Nb, NbN, NbC$_x$, NbB$_x$ Mo, MoN, MoC$_x$, MoB$_x$, W, WN, WC$_x$, WB$_x$, V, Cr, Fe, Cu, Co, Ni, Cd, Zn, Al, Ag, Au, Ru, RuO$_x$, Rh, Pt, Pd, Ir, IrO$_x$ and Os.

10. The process of claim 1, wherein the second reactant gas is provided by pulsing oxygen into the reaction chamber.

11. A method for selectively depositing a noble metal layer on a substrate comprising a first surface and a second insulating surface, the first surface comprising a high k material, metal, metal nitride or conductive metal oxide, the method comprising depositing a layer comprising a noble metal on the first surface relative to the second surface using an atomic layer deposition (ALD) process, wherein both the first surface and second surface are contacted with each of at least two reactants.

12. The method of claim 11, wherein the insulating surface comprises a form of silicon oxide.

13. A method for selectively depositing a metal layer on a substrate comprising a first surface and a second insulating surface, the first surface comprising a high k material, metal, metal nitride or conductive metal oxide, the method comprising depositing a layer comprising a metal on the first surface relative to the second surface using an atomic layer deposition (ALD) process, wherein both the first surface and second surface are contacted with each of at least two reactants and wherein the temperature is below about 400° C.

14. The method of claim 13, wherein the second insulating surface comprises a material selected from the group consisting of silicon oxides, silicon nitrides, silicon oxynitrides, fluorinated silica glass (FSG), carbon doped silicon oxide (SiOC) and materials containing more than about 50% silicon oxide.

15. The method of claim 13, wherein the second insulating surface comprises HfO$_2$, ZrO$_2$, Al$_2$O$_3$, TiO$_2$, Ta$_2$O$_5$, lanthanide oxides, yttria stabilized zirconia, barium strontium titanate, strontium titanate, strontium bismuth tantalate, and bismuth tantalate.

16. The method of claim 13, wherein one of the reactants is an oxygen-containing reactant.

17. The method of claim 13, wherein the first surface comprises a metal, metal nitride, metal carbide, metal boride, conductive oxide, or mixtures thereof.

18. The method of claim 17, wherein the first surface comprises a material selected from the group consisting of Ta, TaN, TaC$_x$, TaB$_x$, Ti, TiN, TiC$_x$, TiB$_x$, Nb, NbN, NbC$_x$, NbB$_x$ Mo, MoN, MoC$_x$, MoB$_x$, W, WN, WC$_x$, WB$_x$, V, Cr, Fe, Cu, Co, Ni, Cd, Zn, Al, Ag, Au, Ru, RuO$_x$, Rh, Pt, Pd, Ti, IrO$_x$ and Os.

19. The process of claim 13, wherein the metal layer is not formed on the second surface.

20. The process of claim 13, wherein the metal layer that is deposited is thicker on the first surface than on the second surface.

21. The process of claim 13, wherein the first surface comprises copper.

22. The process of claim 13, wherein the metal is a noble metal.

* * * * *

UNITED STATES PATENT AND TRADEMARK OFFICE
CERTIFICATE OF CORRECTION

PATENT NO. : 7,985,669 B2
APPLICATION NO. : 12/649817
DATED : July 26, 2011
INVENTOR(S) : Hannu Huotari, Marko Tuominen and Miika Leinikka It is certified that error appears in the above-identified patent and that said Letters Patent is hereby corrected as shown below:

At Page 1, Item 75, Line 1, please change "Espo" to --Espoo--

At Page 1, Item 75, Line 3, please change "Laajanitynkuja (FI);" to --Laajaniitynkuja (FI)--

At Column 3, Line 18, please change "$NbB_x$ Mo," to --$NbB_x$, Mo,--

At Column 9, Line 56, Claim 9, please insert --,-- after "$NbB_x$"

At Column 10, Line 44, Claim 18, please change "$Ti, Tin, TiC_x$," to --Ti, Tin, $TiC_x$,--

At Column 10, Line 44, Claim 18, please change "$NbB_x$ Mo," to --$NbB_x$, Mo,--

At Column 10, Line 46, Claim 18, please change "Ti," to --Ir--

Signed and Sealed this
Eleventh Day of September, 2012

David J. Kappos
*Director of the United States Patent and Trademark Office*